United States Patent
Sano

(10) Patent No.: US 10,523,481 B1
(45) Date of Patent: Dec. 31, 2019

(54) ANTENNA DEVICE AND SIGNAL RECEPTION METHOD

(71) Applicant: KABUSHIKI KAISHA TOSHIBA, Minato-ku, Tokyo (JP)

(72) Inventor: Makoto Sano, Kawasaki Kanagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 16/289,407

(22) Filed: Feb. 28, 2019

(30) Foreign Application Priority Data

Jun. 20, 2018 (JP) .................................. 2018-117354

(51) Int. Cl.
*H04L 27/22* (2006.01)
*H04B 1/16* (2006.01)

(52) U.S. Cl.
CPC .............. *H04L 27/22* (2013.01); *H04B 1/16* (2013.01)

(58) Field of Classification Search
CPC combination set(s) only.
See application file for complete search history.

(56) References Cited

U.S. PATENT DOCUMENTS

| 6,078,297 A * | 6/2000 | Kormanyos ............ H01P 1/161 343/756 |
| 6,535,180 B1 * | 3/2003 | Gregorwich ....... H01Q 13/0258 343/895 |
| 9,571,183 B2 | 2/2017 | Runyon et al. |
| 2015/0381265 A1 | 12/2015 | Runyon et al. |
| 2019/0081685 A1 | 3/2019 | Sano et al. |

FOREIGN PATENT DOCUMENTS

| JP | 3249049 B2 | 1/2002 |
| JP | 3566419 B2 | 9/2004 |
| JP | 2019-050521 A | 3/2019 |
| JP | 2019-125829 A | 7/2019 |

* cited by examiner

*Primary Examiner* — Junpeng Chen
(74) *Attorney, Agent, or Firm* — Foley & Lardner LLP

(57) ABSTRACT

According to one embodiment, an antenna device includes an antenna, a first circuit, a second circuit and a control processing circuit. The antenna receives a radio wave signal and separates the radio wave signal into a right-hand circularly polarized wave signal and a left-hand circularly polarized wave signal. The first circuit divides the right-hand circularly polarized wave signal into a first right-hand circularly polarized wave signal and a second right-hand circularly polarized wave signal. The second circuit divides the left-hand circularly polarized wave signal into a first left-hand circularly polarized wave signal and a second left-hand circularly polarized wave signal. The control processing circuit detects a phase difference between the first right-hand circularly polarized wave signal and the first left-hand circularly polarized wave signal.

20 Claims, 12 Drawing Sheets

US 10,523,481 B1

ANTENNA DEVICE AND SIGNAL RECEPTION METHOD

CROSS REFERENCE TO RELATED APPLICATIONS

This application is based upon and claims the benefit of priority from the prior Japanese Patent Application No. 2018-117354, filed on Jun. 20, 2018, the entire contents of which are incorporated herein by reference.

FIELD

Embodiments described herein relate to an antenna device and a signal reception method.

BACKGROUND

There is a polarization plane detection device configured to separate a radio wave such as a linearly polarized wave received by a dual right-hand/left-hand circularly polarized antenna into a right-hand circularly polarized wave signal and a left-hand circularly polarized wave signal and obtain a polarization plane of the received radio wave from the separated right-hand circularly polarized wave signal and left-hand circularly polarized wave signal. This device alternately switches and outputs the separated right-hand circularly polarized wave signal and left-hand circularly polarized wave signal at a sufficiently high speed, and shapes the output right-hand circularly polarized wave signal and left-hand circularly polarized wave signal using a low pass filter. By detecting a phase difference between the shaped right-hand circularly polarized wave signal and left-hand circularly polarized wave signal, the polarization plane detection device obtains the polarization plane of the received radio wave.

This device uses all the separated right-hand circularly polarized wave signal and left-hand circularly polarized wave signal to detect the polarization plane, and so it is not possible to use the dual right-hand/left-hand circularly polarized antenna for communication or the like. Furthermore, since output destinations of the right-hand circularly polarized wave signal and the left-hand circularly polarized wave signal need to be switched at a high frequency, there are problems that a switching circuit becomes complicated or noise is produced.

DETAILED DESCRIPTION

According to one embodiment, an antenna device includes an antenna, a first circuit, a second circuit and a control processing circuit. The antenna receives a radio wave signal and separates the radio wave signal into a right-hand circularly polarized wave signal and a left-hand circularly polarized wave signal. The first circuit divides the right-hand circularly polarized wave signal into a first right-hand circularly polarized wave signal and a second right-hand circularly polarized wave signal. The second circuit divides the left-hand circularly polarized wave signal into a first left-hand circularly polarized wave signal and a second left-hand circularly polarized wave signal. The control processing circuit detects a phase difference between the first right-hand circularly polarized wave signal and the first left-hand circularly polarized wave signal.

Hereinafter, embodiments will be described in detail with reference to the accompanying drawings.

First Embodiment

Figure 1:
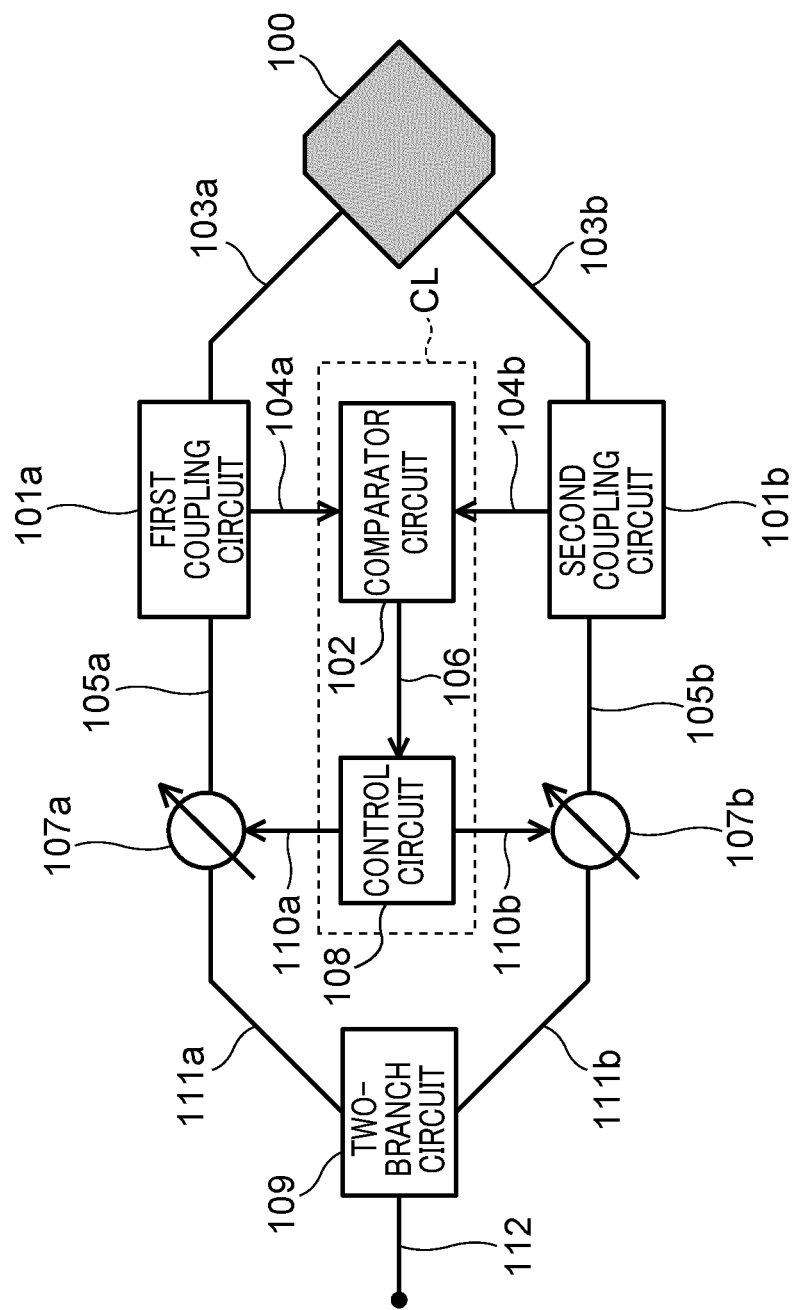
FIG. 1 is a diagram illustrating a schematic configuration of an antenna device according to a first embodiment.

FIG. 1 is a diagram illustrating an example of an antenna device according to a first embodiment. The antenna device in FIG. 1 is provided with an antenna (radiating element) 100, a first coupling circuit (first circuit) 101a, a second coupling circuit (second circuit) 101b, a first phase shifter (first phase shift circuit) 107a, a second phase shifter (second phase shift circuit) 107b, a two-branch circuit 109, and a control processing circuit CL. The control processing circuit CL is provided with a comparator circuit 102 and a control circuit 108.

The antenna 100 is connected to the first coupling circuit 101a via a transmission line 103a and connected to the second coupling circuit 101b via a transmission line 103b. More specifically, the antenna 100 is provided with a first terminal (terminal for a right-hand circularly polarized wave) and a second terminal (terminal for a left-hand circularly polarized wave), the terminal for the right-hand polarized wave is connected to the transmission line 103a and the terminal for the left-hand circularly polarized wave is connected to the transmission line 103b. Furthermore, the first coupling circuit 101a is connected to the comparator circuit 102 via a transmission line 104a and the second coupling circuit 101b is connected to the comparator circuit 102 via a transmission line 104b. Furthermore, the comparator circuit 102 is connected to the control circuit 108 via a transmission line 106. The first coupling circuit 101a is connected to the first phase shifter 107a via a transmission line 105a. The second coupling circuit 101b is connected to the second phase shifter 107b via a transmission line 105b. The control circuit 108 is connected to the first phase shifter 107a via a transmission line 110a and connected to the second phase shifter 107b via a transmission line 110b. The two-branch circuit 109 is connected to the first phase shifter 107a via a transmission line 111a and connected to the second phase shifter 107*b* via a transmission line 111*b*. The two-branch circuit 109 is connected to a high frequency circuit (not shown) via a transmission line 112.

In the following description, a high frequency signal being transmitted through the transmission lines 103*a*, 104*a*, 105*a* and 111*a* may be referred to as a "right-hand circularly polarized wave signal" and a high frequency signal being transmitted through the transmission lines 103*b*, 104*b*, 105*b* and 111*b* may be referred to as a "left-hand circularly polarized wave signal."

The antenna 100 transmits/receives electromagnetic waves (radio waves). For example, the antenna 100 transmits/receives right-hand circularly polarized waves and left-hand circularly polarized waves. During transmission, when a high frequency signal (right-hand circularly polarized wave signal) is input from the transmission line 103*a* to the antenna 100, a right-hand circularly polarized wave is radiated from the antenna 100. Furthermore, when a high frequency signal (left-hand circularly polarized wave signal) is input from the transmission line 103*b* to the antenna 100, a left-hand circularly polarized wave is radiated from the antenna 100. When high frequency signals with equal amplitude are input to the antenna 100 from the transmission line 103*a* and the transmission line 103*b* simultaneously, a radio wave (linearly polarized wave) in which a right-hand circularly polarized wave and a left-hand circularly polarized wave overlap each other is radiated. During reception, when the antenna 100 receives a radio wave such as a linearly polarized wave in which a right-hand circularly polarized wave and a left-hand circularly polarized wave overlap each other, the received radio wave is separated into a high frequency signal (right-hand circularly polarized wave signal) corresponding to the right-hand circularly polarized wave and a high frequency signal (left-hand circularly polarized wave signal) corresponding to the left-hand circularly polarized wave, the right-hand circularly polarized wave signal is output to the transmission line 103*a* and the left-hand circularly polarized wave signal is output to the transmission line 103*b*. Note that when the antenna 100 receives a right-hand circularly polarized wave, a high frequency signal (right-hand circularly polarized wave signal) is output to the transmission line 103*a*, and when the antenna 100 receives a left-hand circularly polarized wave, a high frequency signal (left-hand circularly polarized wave signal) is output to the transmission line 103*b*.

The antenna 100 can assume any configuration as long as such a configuration allows the right-hand circularly polarized wave and left-hand circularly polarized wave to be transmitted/received. FIG. 1 illustrates a patch antenna with truncated corners as an example of such an antenna. As the configuration of the antenna 100, there can be many other examples.

Figure 2:
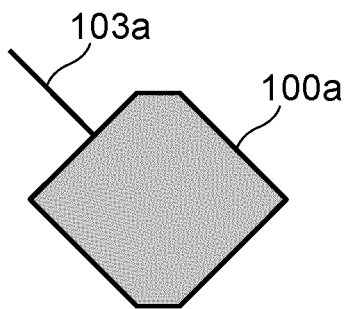
FIG. 2 is a diagram illustrating modifications of an antenna.
Figure 2:
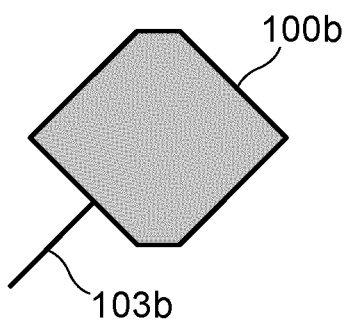

FIG. 2 illustrates an example of a configuration of the antenna 100 constructed of two radiating elements: a radiating element 100*a* that radiates a right-hand circularly polarized wave and a radiating element 100*b* that radiates a left-hand circularly polarized wave. The transmission line 103*a* is connected to the radiating element 100*a* and the transmission line 103*b* is connected to the radiating element 100*b*.

Figure 3:
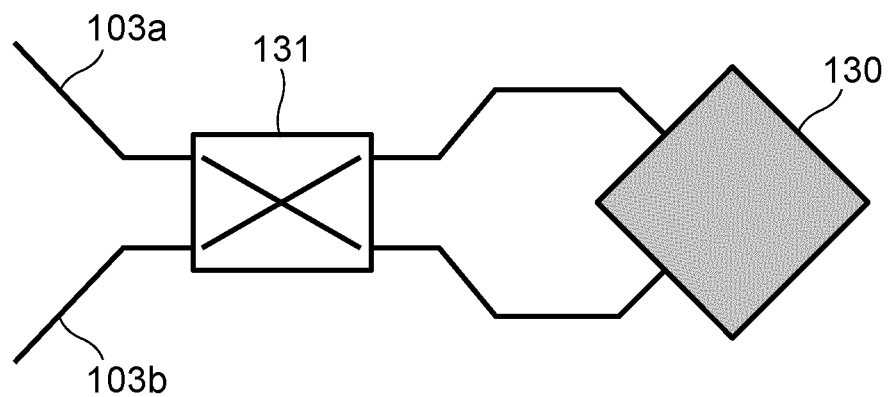
FIG. 3 is a diagram illustrating a modification of an antenna.

FIG. 3 illustrates a configuration of the antenna 100 in which an external circuit 131 such as a 90° hybrid coupler is connected to a patch antenna (dual linearly polarized antenna) 130 that generates two linearly polarized waves orthogonal to each other. In this case, the external circuit 131 gives a phase difference of ±90° to the two input linearly polarized waves orthogonal to each other and thereby generates a right-hand circularly polarized wave and a left-hand circularly polarized wave.

In addition to the aforementioned configurations, a sequential array that generates circularly polarized waves by exciting a plurality of linearly polarized wave antennas by giving a phase difference may also be used as the antenna 100.

The antenna 100 is not limited to the patch antenna, but can be any antenna if it can transmit/receive right-hand circularly polarized waves and left-hand circularly polarized waves such as a dipole antenna, a helical antenna, a spiral antenna, a loop antenna, a dielectric resonator antenna, an antenna using a waveguide having a septum polarizer or an orthogonal mode transducer, a slot antenna, a reflector antenna, a lens antenna, an antenna using a metasurface or antenna combining these antennas. The antenna 100 may also be an array antenna in which a plurality of these singular antennas are arrayed.

In FIG. 1, during reception, the first coupling circuit 101*a* divides a high frequency signal (right-hand circularly polarized wave signal) input from the transmission line 103*a* into two portions through power division and outputs one portion (first right-hand circularly polarized wave signal) to the transmission line 104*a* and outputs the other portion (second right-hand circularly polarized wave signal) to the transmission line 105*a*. That is, the first coupling circuit 101*a* extracts at least part of the high frequency signal and outputs it to the transmission line 104*a* and outputs the remaining part to the transmission line 105*a*. A power division ratio may be optional as long as each divided signal satisfies a power level required in a posterior process. Similarly, the second coupling circuit 101*b* divides a high frequency signal (left-hand circularly polarized wave signal) input from the transmission line 103*b* into two portions through power division and outputs one portion (first left-hand circularly polarized wave signal) to the transmission line 104*b* and outputs the other portion (second left-hand circularly polarized wave signal) to the transmission line 105*b*. That is, the second coupling circuit 101*b* extracts at least part of the high frequency signal and outputs it to the transmission line 104*b* and outputs the remaining part to the transmission line 105*b*. A power division ratio between the first coupling circuit 101*a* and the second coupling circuit 101*b* may be the same or different. That is, the power division ratio between the transmission lines 104*a* and 105*a* may be the same as or different from the power division ratio between the transmission lines 104*b* and 105*b*. The present embodiment assumes that the power division ratio between the transmission lines 104*a* and 105*a* is the same as the power division ratio between the transmission lines 104*b* and 105*b*.

During transmission, the first coupling circuit 101*a* divides a high frequency signal (right-hand circularly polarized wave signal) input from the transmission line 105*a* into two portions through power division, outputs one portion to the transmission line 103*a* and outputs the other portion to the transmission line 104*a*. That is, the first coupling circuit 101*a* extracts at least part of the high frequency signal and outputs it to the transmission line 103*a* and outputs the remaining part to the transmission line 104*a*. The power division ratio may be optional. However, the first coupling circuit 101*a* may also be configured not to perform power division but to output all the input high frequency signal to the transmission line 103*a*. Similarly, the second coupling circuit 101*b* divides a high frequency signal (left-hand circularly polarized wave signal) input from the transmission line 105*b* into two portions through power division, outputs one portion to the transmission line 103b and outputs the other portion to the transmission line 104b. That is, the second coupling circuit 101b extracts at least part of the high frequency signal, outputs it to the transmission line 103b and outputs the remaining part to the transmission line 104b. The power division ratio may be optional. However, the second coupling circuit 101b may also be configured not to perform power division but to output all the input high frequency signal to the transmission line 103a. The power division ratio may be the same as or different from the power division ratio between the first coupling circuit 101a and the second coupling circuit 101b. That is, the power division ratio between the transmission lines 103a and 104a may be the same as or different from the power division ratio between the transmission lines 103b and 104b. The present embodiment assumes that the power division ratio between the transmission lines 103a and 104a is the same as the power division ratio between the transmission lines 103b and 104b.

The comparator circuit 102 detects amplitude phase of the right-hand circularly polarized wave signal input from the transmission line 104a and a phase of the left-hand circularly polarized wave signal input from the transmission line 104b and detects a phase difference between these signals based on the detected amplitudes. The comparator circuit 102 outputs a signal including information on the detected phase difference (phase difference information) to the control circuit 108 via the transmission line 106. The signal including the phase difference information may have any form, for example, a high frequency signal, a modulated signal or a DC signal. When the amplitude of the right-hand circularly polarized wave signal input from the transmission line 104a and the amplitude of the left-hand circularly polarized wave signal input from the transmission line 104b are known (e.g., investigated in advance), the comparator circuit 102 need not detect amplitudes. In the following description, phase difference information detected during transmission may be referred to as "transmission phase difference information" and phase difference information detected during reception may be referred to as "reception phase difference information."

The first phase shifter 107a shifts the phase of the right-hand circularly polarized wave signal input from the transmission line 105a based on a control signal specified from the control circuit 108. Similarly, the second phase shifter 107b shifts the phase of the left-hand circularly polarized wave signal input from the transmission line 105b based on a control signal specified from the control circuit 108. Furthermore, the first phase shifter 107a shifts the phase of the right-hand circularly polarized wave signal input from the transmission line 111a based on a control signal specified from the control circuit 108. Similarly, the second phase shifter 107b shifts the phase of the left-hand circularly polarized wave signal input from the transmission line 111b based on a control signal specified from the control circuit 108.

The first phase shifter 107a and the second phase shifter 107b may be an analog phase shifter that can shift a phase shift amount continuously or a digital phase shifter that can shift a phase shift amount discretely. These phase shifters may be a phase shifter that switches a line length through a PIN diode, an FET, a MEMS switch or the like or a ferrite phase shifter, or a MEMS phase shifter. These phase shifters may be a reflection type phase shifter combining a variable impedance element such as a varactor diode and a 90° hybrid coupler or a reflection type phase shifter combining a transmission line, a line length of which is switchable, and a 90° hybrid coupler. These phase shifters may also be a reflection type phase shifter combining a variable impedance element such as a varactor diode, a transmission line, a line length of which is switchable, and a 90° hybrid coupler.

The control circuit 108 controls phase shift amounts of the first phase shifter 107a and the second phase shifter 107b based on at least one of the reception phase difference information and the transmission phase difference information input from the comparator circuit 102. The control circuit 108 determines the phase shift amount of the first phase shifter 107a and the phase shift amount of the second phase shifter 107b based on the reception phase difference information or the transmission phase difference information. The control circuit 108 outputs a control signal indicating the phase shift amount of the first phase shifter 107a to the first phase shifter 107a via the transmission line 110a. The control circuit 108 outputs a control signal indicating the phase shift amount of the second phase shifter 107b to the second phase shifter 107b via the transmission line 110b. The control signal may have any form such as a high frequency signal, a modulated signal or a DC signal.

As an example, during reception, the control circuit 108 controls phase shift amounts of the first phase shifter 107a and the second phase shifter 107b so as to synchronize phases of the right-hand circularly polarized wave signal output from the first phase shifter 107a to the transmission line 111a and the left-hand circularly polarized wave signal output from the second phase shifter 107b to the transmission line 111b and so as to set to 0 or make smaller the phase difference indicated by the reception phase difference information. Controlling these signals so that they are in phase with each other causes the right-hand circularly polarized wave signal being transmitted through the transmission line 111a and the left-hand circularly polarized wave signal being transmitted through the transmission line 111b to be synthesized in the two-branch circuit 109 with the same amplitude (assuming a case where insertion loss and electrical length of propagation path at each coupling circuit and each phase shifter are equal between the right-hand circularly polarized wave signal and the left-hand circularly polarized wave signal) and the same phase. This maximizes the high frequency signal output to the transmission line 112. Note that when the right-hand circularly polarized wave signal of the transmission line 111a and the left-hand circularly polarized wave signal of the transmission line 111b have the same amplitude and reverse phases, no high frequency signal is output to the transmission line 112.

Furthermore, the control circuit 108 identifies the polarization plane (polarization angle) received by the antenna 100 from the reception phase difference information. During transmission, the control circuit 108 controls phase shift amounts of the first phase shifter 107a and the second phase shifter 107b so that the polarization plane of the transmission radio wave matches the identified polarization plane. That is, the control circuit 108 controls the phase shift amounts of the first phase shifter 107a and the second phase shifter 107b so that the transmission phase difference information matches or approaches a phase difference corresponding to the identified polarization plane (phase difference indicated by the reception phase difference information detected during reception). This causes a phase difference between the right-hand circularly polarized wave signal and the left-hand circularly polarized wave signal to be transmitted to match or approach the phase difference (phase difference indicated by the reception phase difference information) corresponding to the detected polarization plane and allows the polarization plane of the radio wave to be transmitted to match the polarization plane of the antenna of the transmission counterpart device.

During reception, the two-branch circuit 109 synthesizes the right-hand circularly polarized wave signal input from the transmission line 111a and the left-hand circularly polarized wave signal input from the transmission line 111b and outputs a high frequency signal which is the synthesized signal to the transmission line 112. For example, the two-branch circuit 109 synthesizes the input right-hand circularly polarized wave signal and left-hand circularly polarized wave signal with the same weight. Different weights can also be used for both signals. During transmission, the two-branch circuit 109 divides a high frequency signal input from the transmission line 112 and outputs the divided signals to the transmission lines 111a and 111b. For example, the two-branch circuit 109 divides the high frequency signal input from the transmission line 112 with the same weight and outputs the one of the divided signals (right-hand circularly polarized wave signal) to the transmission line 111a and the other signal (left-hand circularly polarized wave signal) to the transmission line 111b. The two-branch circuit 109 can be constructed of a Wilkinson divider, a T junction, a magic Tee, a 90° hybrid, a rat race coupler or the like. When the two-branch circuit 109 performs the above-described distribution with equal amplitude, it is possible to achieve a higher level of cross-polarization discrimination. Note that since the first phase shifter 107a and the second phase shifter 107b perform phase shift, the two-branch circuit 109 need not always perform distribution and synthesis with the same phase.

The transmission lines 103a, 103b, 104a, 104b, 105a, 105b, 111a, 111b and 112 are transmission lines through which high frequency signals are transmitted. Examples of such transmission lines include a coplanar line, a microstrip line, a strip line, a parallel two-wire line, a coaxial line and a waveguide. If the pair of transmission lines 103a and 103b, the pair of transmission lines 104a and 104b and the pair of transmission lines 105a and 105b are made up of the same transmission lines, types of the transmission lines 103a, 104a and 105a may be different. Furthermore, circuit elements such as capacitors and inductors may be connected to the transmission lines 103a, 103b, 104a, 104b, 105a and 105b.

The transmission lines 106, 110a and 110b are formed of transmission lines corresponding to the type of a signal transmitted. Therefore, the transmission lines 106, 110a and 110b can be formed of various types of transmission lines as in the case of the aforementioned transmission line 103a or the like when transmitting a high frequency signal. These transmission lines may also be formed of lead wires, circuit board wires or bonding wires or the like when transmitting a modulated signal or DC signal.

Hereinafter, reception operation of the antenna device in FIG. 1 will be described.

The antenna 100 receives a radio wave and this radio wave is separated into a high frequency signal corresponding to a right-hand circularly polarized wave (right-hand circularly polarized wave signal) and a high frequency signal corresponding to a left-hand circularly polarized wave (left-hand circularly polarized wave signal). The right-hand circularly polarized wave signal is input from the transmission line 103a to the first coupling circuit 101a and the left-hand circularly polarized wave signal is input from the transmission line 103b to the second coupling circuit 101b. The right-hand circularly polarized wave signal input to the first coupling circuit 101a is distributed to the transmission line 104a and the transmission line 105a. Similarly, the left-hand circularly polarized wave signal input to the second coupling circuit 101b is distributed to the transmission line 104b and the transmission line 105b.

The comparator circuit 102 detects a phase difference between the right-hand circularly polarized wave signal input from the transmission line 104a and the left-hand circularly polarized wave signal input from the transmission line 104b and outputs a signal including information on the detected phase difference (reception phase difference information) to the transmission line 106. The signal including the reception phase difference information output to the transmission line 106 is input to the control circuit 108. The control circuit 108 may store the reception phase difference information included in the input signal in a storage such as an internal memory or an accessible external memory. However, storing the reception phase difference information is not essential and a configuration without storing the reception phase difference information is also possible.

The control circuit 108 controls a phase shift amount of the first phase shifter 107a and a phase shift amount of the second phase shifter 107b according to the reception phase difference information. For example, the control circuit 108 determines the phase shift amount of and the first phase shifter 107a and the phase shift amount of the second phase shifter 107b to synchronize phases of the right-hand circularly polarized wave signal output to the transmission line 111a and the left-hand circularly polarized wave signal output to the transmission line 111b. The control circuit 108 instructs the first phase shifter 107a and the second phase shifter 107b on the determined phase shift amounts through control signals respectively.

The first phase shifter 107a shifts the phase of the right-hand circularly polarized wave signal input from the transmission line 105a according to the phase shift amount instructed from the control circuit 108 and outputs the phase-shifted right-hand circularly polarized wave signal to the transmission line 111a. On the other hand, the second phase shifter 107b shifts the phase of the left-hand circularly polarized wave signal input from the transmission line 105b according to the phase shift amount instructed from the control circuit 108 and outputs the phase-shifted left-hand circularly polarized wave signal to the transmission line 111b.

The two-branch circuit 109 synthesizes the right-hand circularly polarized wave signal input from the transmission line 111a and the left-hand circularly polarized wave signal input from the transmission line 111b and outputs the synthesized signal to the transmission line 112. When the right-hand circularly polarized wave signal input from the transmission line 111a and the left-hand circularly polarized wave signal input from the transmission line 111b are controlled so that they are in-phase with each other, the amplitude of the high frequency signal output to the transmission line 112 is maximized.

During reception, phase shift amounts of the first phase shifter 107a and the second phase shifter 107b are controlled according to the phase difference between the right-hand circularly polarized wave signal and the left-hand circularly polarized wave signal, and it is thereby possible for the two-branch circuit 109 to synthesize the right-hand circularly polarized wave signal and the left-hand circularly polarized wave signal with high efficiency. This makes it possible to maximize or increase the magnitude of a high frequency signal output from the transmission line 112. Furthermore, it is possible to achieve a favorable level of cross-polarization discrimination.

Next, transmission operation of the antenna device in FIG. 1 will be described. A high frequency signal input from a high frequency circuit (not shown) via the transmission line 112 is divided at the two-branch circuit 109, for example, with equal amplitude and the respective divided signals are input to the first phase shifter 107a and the second phase shifter 107b via the transmission lines 111a and 111b. Before being instructed from the control circuit 108 about phase shift amounts, the first phase shifter 107a and the second phase shifter 107b perform phase shifts with phase shift amounts specified in advance. The first phase shifter 107a shifts the phase of a signal input from the transmission line 111a (right-hand circularly polarized wave signal) and outputs the phase-shifted signal to the transmission line 105a. The second phase shifter 107b shifts the phase of a signal input from the transmission line 111b (left-hand circularly polarized wave signal) and outputs the phase-shifted signal to the transmission line 105b.

The first coupling circuit 101a distributes the signal input from the transmission line 105a to the transmission line 103a and the transmission line 104a. The second coupling circuit 101b distributes the signal input from the transmission line 105b to the transmission line 103b and the transmission line 104b. The comparator circuit 102 detects a phase difference of the signals input from the transmission lines 104a and 104b and outputs (feeds back) a signal including information on the detected phase difference (transmission phase difference information) to the control circuit 108.

The control circuit 108 performs feedback control of a phase shift amount between the first phase shifter 107a and the second phase shifter 107b based on the transmission phase difference information included in the signal input from the comparator circuit 102. That is, the control circuit 108 performs control so that the phase difference between the signal output from the first phase shifter 107a to the transmission line 105a and the signal output from the second phase shifter 107b to the transmission line 105b matches or approaches the aforementioned detected reception phase difference information or a desired phase difference. Even when a phase shift amount of a phase shifter deviates from a desired value due to a production irregularity of the phase shifter or an ambient temperature variation or the like, it is possible to adjust phase shift amounts of the first phase shifter 107a and the second phase shifter 107b to desired values.

The antenna 100 generates and outputs a right-hand circularly polarized wave from a signal input from the first coupling circuit 101a, and generates and outputs a left-hand circularly polarized wave from a signal input from the second coupling circuit 101b. For example, by receiving the right-hand circularly polarized wave and the left-hand circularly polarized wave with, for example, a desired phase difference, the antenna 100 transmits a linearly polarized wave with a desired polarization plane in which the right-hand circularly polarized wave and the left-hand circularly polarized wave are synthesized. When the right-hand circularly polarized wave and the left-hand circularly polarized wave have equal amplitudes, the antenna 100 transmits a linearly polarized wave.

Thus, by controlling phase shift amounts of the first phase shifter 107a and the second phase shifter 107b according to the phase difference between the right-hand circularly polarized wave signal and the left-hand circularly polarized wave signal during transmission, it is possible to transmit a linearly polarized wave with a desired polarization plane from the antenna and achieve a more favorable level of cross-polarization discrimination.

Figure 4:
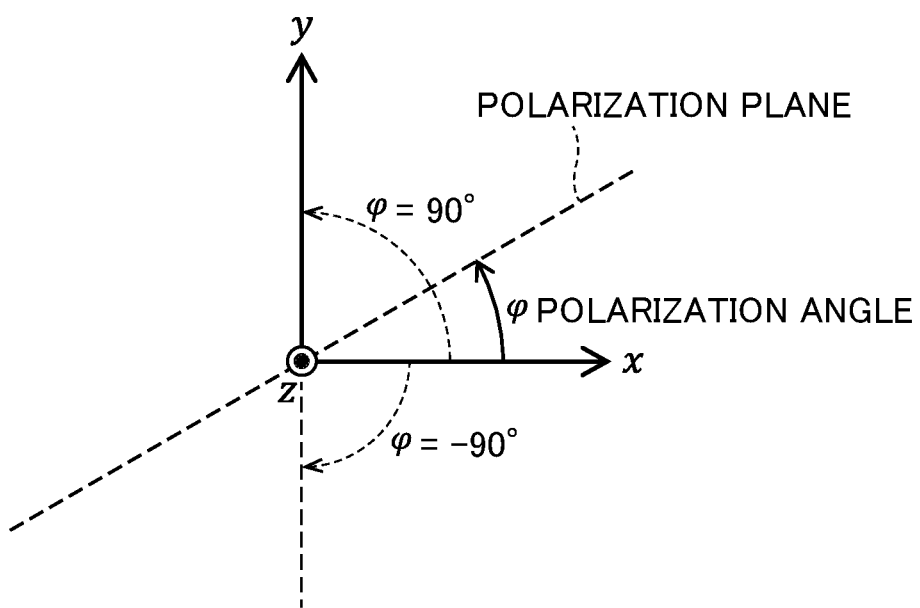
FIG. 4 is a diagram illustrating a polarization plane and a polarization angle.

Hereinafter, principles of polarization plane detection (phase difference detection) of the antenna device will be described using FIG. 4. FIG. 4 illustrates a polarization angle and a polarization plane in a xyz coordinate system.

A radio wave propagating in a z-axis positive direction (backward direction along the sheet surface) (linearly polarized wave $\vec{E}_{lin}$ is expressed as $$\vec{E}_{lin} = \hat{x} E_0 \cos \varphi + \hat{y} E_0 \sin \varphi \tag{1}$$

where $E_0$ is an amplitude of a linearly polarized wave, and $\varphi$ is an angle of inclination (polarization angle) of the polarization plane from an x-axis. $\hat{x}, \hat{y}$ are unit vectors in x-axis and y-axis directions. The right-hand circularly polarized wave $\vec{E}_{RHCP}$ and the left-hand circularly polarized wave propagating in the z-axis positive direction $\vec{E}_{LHCP}$ are respectively expressed as $$\vec{E}_{RHCP} = \hat{x} \frac{1}{\sqrt{2}} E_0 + \hat{y} \frac{j}{\sqrt{2}} E_0 \tag{2-1}$$

$$\vec{E}_{LHCP} = \hat{x} \frac{1}{\sqrt{2}} E_0 - \hat{y} \frac{j}{\sqrt{2}} E_0 \tag{2-2}$$

Using the right-hand circularly polarized wave $\vec{E}_{RHCP}$ and the left-hand circularly polarized wave $\vec{E}_{LHCP}$, the linearly polarized wave $\vec{E}_{lin}$ is expressed as $$\vec{E}_{lin} = \frac{\exp(-j\varphi)}{\sqrt{2}} \vec{E}_{RHCP} + \frac{\exp(j\varphi)}{\sqrt{2}} \vec{E}_{LHCP} \frac{\exp(j\varphi)}{\sqrt{2}} \left[ \vec{E}_{RHCP} \exp(-j2\varphi) + \vec{E}_{LHCP} \right] \tag{3}$$

It is seen from equation (3) that, the linearly polarized wave $\vec{E}_{lin}$ with a polarization angle of $\varphi$ can be expressed by overlapping the right-hand circularly polarized wave $\vec{E}_{RHCP}$ and the left-hand circularly polarized wave $\vec{E}_{LHCP}$ which have equal amplitude and have a phase difference $2\varphi$.

Therefore, when the antenna receives the linearly polarized wave $\vec{E}_{lin}$, the signal of the linearly polarized wave $\vec{E}_{lin}$ is separated, the phase of the signal of the right-hand circularly polarized wave $\vec{E}_{RHCP}$ and the phase of the signal of the left-hand circularly polarized wave $\vec{E}_{LHCP}$ are compared to obtain a phase difference $2\varphi$ and the phase difference is multiplied by ½ to obtain a polarization angle of the linearly polarized wave $\varphi$. Furthermore, at the time of transmission, the signal of the right-hand circularly polarized wave $\vec{E}_{RHCP}$ and the signal of the left-hand circularly polarized wave $\vec{E}_{LHCP}$ which have a phase difference $2\varphi$ and have equal amplitude are overlapped, and a linearly polarized wave $\vec{E}_{lin}$ of a polarization angle of $\varphi$ is generated.

As shown in FIG. 4, $\varphi=90°$ and $\varphi=-90°$ represent the same polarization plane. Therefore, in order to obtain an arbitrary polarization plane during reception, it is necessary to detect a relative phase difference between the right-hand circularly polarized wave and the left-hand circularly polarized wave within a range of −180° to 180°. Furthermore, in order to generate a linearly polarized wave with an arbitrary polarization plane during transmission, it is necessary to continuously shift the relative phase difference between the right-hand circularly polarized wave and the left-hand circularly polarized wave within a range of −180° to 180°.

Figure 5:
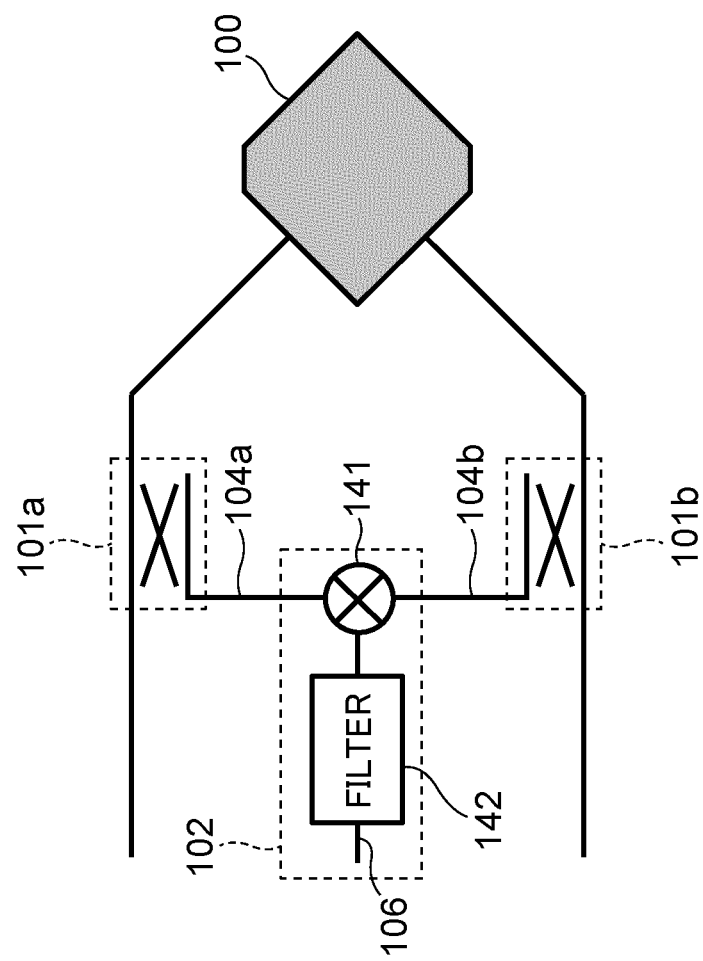
FIG. 5 is a diagram illustrating a configuration example of a comparator circuit.

As an example of a method for detecting a phase difference between the right-hand circularly polarized wave and the left-hand circularly polarized wave, a method using a mixer and a filter will be described. As a first configuration example of a portion of the comparator circuit 102 where a phase difference between the right-hand circularly polarized wave signal and the left-hand circularly polarized wave signal is detected, FIG. 5 illustrates an example using a mixer and a filter. The comparator circuit 102 is provided with a mixer 141 and a filter 142. An input side of the mixer 141 is connected to the first coupling circuit 101a and the second coupling circuit 101b. Directional couplers are used as the first coupling circuit 101a and the second coupling circuit 101b. An output side of the mixer 141 is connected to the filter 142. An output side of the filter 142 may be directly connected to the transmission line 106 or may be connected to the transmission line 106 via an optional calculation circuit.

A high frequency signal input from the transmission line 104a to the mixer 141 $e_{RHCP}(t)$ and a high frequency signal input from the transmission line 104b to the mixer 141 $e_{LHCP}(t)$ are assumed as $$e_{RHCP}(t) = e_1 \cos(\omega t + \psi_1) \quad (4\text{-}1)$$

$$e_{LHCP}(t) = e_2 \cos(\omega t + \psi_2) \quad (4\text{-}2)$$

where,
$e_1, e_2$ represent amplitudes of the high frequency signals, $\psi_1, \psi_2$ represent phases of the high frequency signals, $\omega$ represents an angular frequency of the high frequency signals, t represents a time. When the high frequency signal (right-hand circularly polarized wave signal) $e_{RHCP}(t)$ and the high frequency signal (left-hand circularly polarized wave signal) $e_{LHCP}(t)$ are input to the mixer, a signal expressed by the following equation is output.

$$e_{RHCP}(t)e_{LHCP}(t) = e_1 \cos(\omega t + \psi_1)e_2 \cos(\omega t + \psi_2) = \quad (5)$$
$$\frac{1}{2} e_1 e_2 [\cos(\psi_1 - \psi_2) + \cos(2\omega t + \psi_1 + \psi_2)]$$

That is, amplitudes of the right-hand circularly polarized wave signal and the left-hand circularly polarized wave signal $e_1 e_2$ and $\cos(\Delta\psi)$ which is the cosine of the phase difference $\Delta\psi = \psi_1 - \psi_2$ is multiplied, and a DC signal proportional the product $e_1 e_2 \cos(\Delta\psi)$ (a DC component) and a second harmonic signal are output.

The filter 142 removes the second harmonic signal from the output signal of the mixer 141, only a DC component proportional to $e_1 e_2 \cos(\Delta\psi)$ is thereby obtained. Thus, if $e_1 e_2$ is known or the comparator circuit 102 can detect $e_1 e_2$, it is possible to detect a phase difference between the right-hand circularly polarized wave signal and the left-hand circularly polarized wave signal $\Delta\psi$ within a range of 0 to 180°. The comparator circuit 102 calculates the phase difference $\Delta\psi$ from the value of the DC component and value of $e_1 e_2$ using the above-described calculation circuit and outputs a signal including information of the calculated phase difference to the control circuit 108 via the transmission line 106. The signal output to the transmission line 106 may be a DC signal or an AC signal or a modulated signal. The phase difference may be calculated not by the comparator circuit 102 but may be calculated by the control circuit 108. In this case, the value of the DC component and the value of $e_1 e_2$ may be output from the comparator circuit 102 to the control circuit 108.

However, according to this method, since the cosine of the phase difference $\Delta\psi$ is taken, it is not possible to determine the positive or negative value of $\Delta\psi$. That is, it is not possible to detect a phase difference within a range of −180 to 0°.

Figure 6:
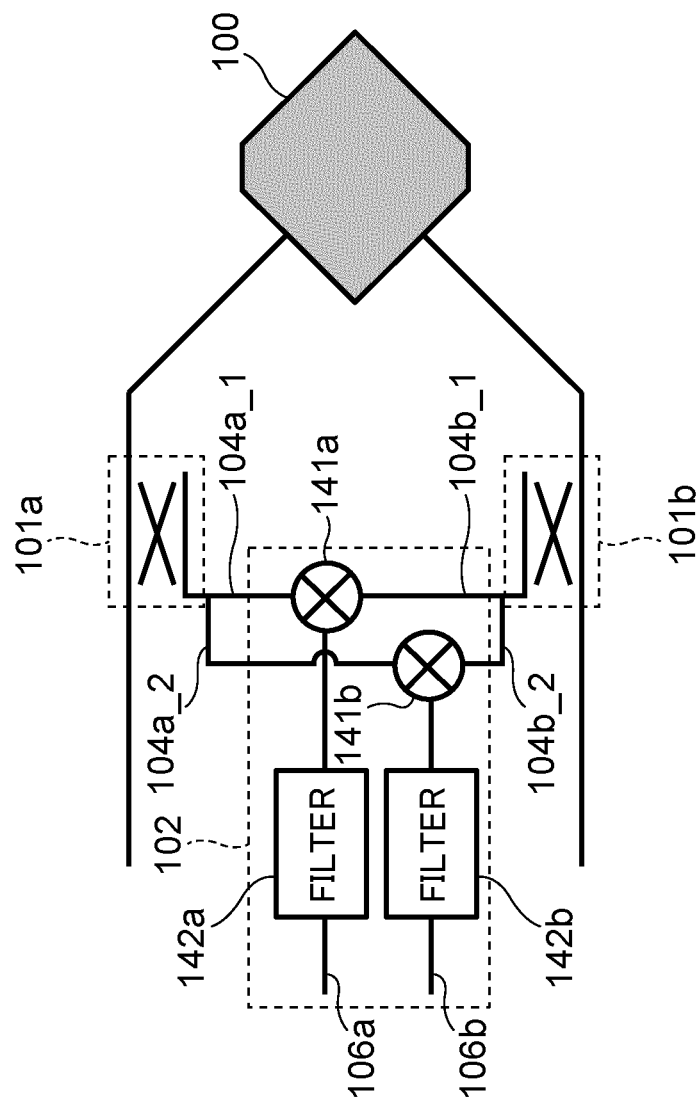
FIG. 6 is a diagram illustrating another configuration example of the comparator circuit.

In order to also detect the range of −180 to 0°, a right-hand circularly polarized wave signal, the phase of which is delayed by 90° may be generated as $e'_{RHCP}(t) = e_1 \cos(\omega t + \psi_1 - 90°)$ (6), and input to the mixer together with the left-hand circularly polarized wave signal $e_{LHCP}(t)$. Therefore, FIG. 6 illustrates a second configuration example of the portion of the comparator circuit 102 for detecting a phase difference between the right-hand circularly polarized wave signal and the left-hand circularly polarized wave signal.

Unlike FIG. 5, there are a plurality of sets of a mixer and a filter. A set of a mixer 141a and a filter 142a, and a set of a mixer 141b and a filter 142b are installed. The mixer 141a is connected to the first coupling circuit 101a via a transmission line 104a_1 and connected to the second coupling circuit 101b via a transmission line 104b_1. Similarly, the mixer 141b is connected to the first coupling circuit 101a via a transmission line 104a_2 and connected to the second coupling circuit 101b via a transmission line 104b_2. A relation regarding the lengths of the transmission lines 104a_1 and 104a_2 is set so that the phase of the right-hand circularly polarized wave signal input to the mixer 141b is relatively shifted by 90° with respect to the right-hand circularly polarized wave signal input to the mixer 141a. On the other hand, the transmission line 104b_1 and the transmission line 104b_2 have equal lengths, and the phase of the left-hand circularly polarized wave signal input from the transmission line 104b_2 to the mixer 141b is the same as the phase of the left-hand circularly polarized wave signal input from the transmission line 104b_2 to the mixer 141b_1.

The mixer 141a receives $e_{RHCP}(t)$ and $e_{LHCP}(t)$ and the mixer 141b receives $e'_{RHCP}(t)$ and $e_{LHCP}(t)$. The output of the mixer 141a is expressed by the aforementioned equation (5). The mixer 141b outputs a signal expressed by the following equation:

$$e'_{RHCP}(t)e_{LHCP}(t) = e_1 \cos(\omega t + \psi_1 - 90°)e_2 \cos(\omega t + \psi_2) = \quad (7)$$
$$\frac{1}{2} e_1 e_2 [\cos(\psi_1 - \psi_2 - 90°) + \cos(2\omega t + \psi_1 + \psi_2 - 90°)] =$$
$$\frac{1}{2} e_1 e_2 [\sin(\psi_1 - \psi_2) + \sin(2\omega t + \psi_1 + \psi_2)]$$

Since the DC component is a DC signal proportional to $e_1 e_2 \sin(\Delta\psi)$, the positive or negative value of $\Delta\psi$ can be determined according to the positive or negative value of $\sin(\Delta\psi)$.

From above, the high frequency signal $e_{RHCP}(t)$ and $e_{LHCP}(t)$ is input to the mixer 141a, and a DC component proportional to $e_1 e_2 \cos(\Delta\psi)$ is acquired as the output of the filter 142a. Furthermore, the right-hand circularly polarized wave signal $e'_{RHCP}(t)$ and the left-hand circularly polarized wave signal $e_{LHCP}(t)$ are input to the mixer 141b, and the positive or negative value of $\Delta\psi$ is acquired as the output of the filter 142*b*. The control circuit 108 or the comparator circuit 102 calculates a phase difference from the value of the acquired DC component and the positive or negative value within a range of −180 to 180°. That is, an arbitrary polarization plane can be detected.

According to the configuration in FIG. 6, the phase of the right-hand circularly polarized wave signal is delayed by 90°, but instead of the phase of the right-hand circularly polarized wave signal, the phase of the left-hand circularly polarized wave signal $e_{LHCP}(t)$ may be delayed by 90°. In this case, the left-hand circularly polarized wave signal, the phase of which is delayed by 90° and the right-hand circularly polarized wave signal, the phase of which is not delayed $e_{RHCP}(t)$ are input to the mixer and the mixer output is filtered and it is thereby possible to determine the positive or negative value of $\Delta\psi$.

Figure 7:
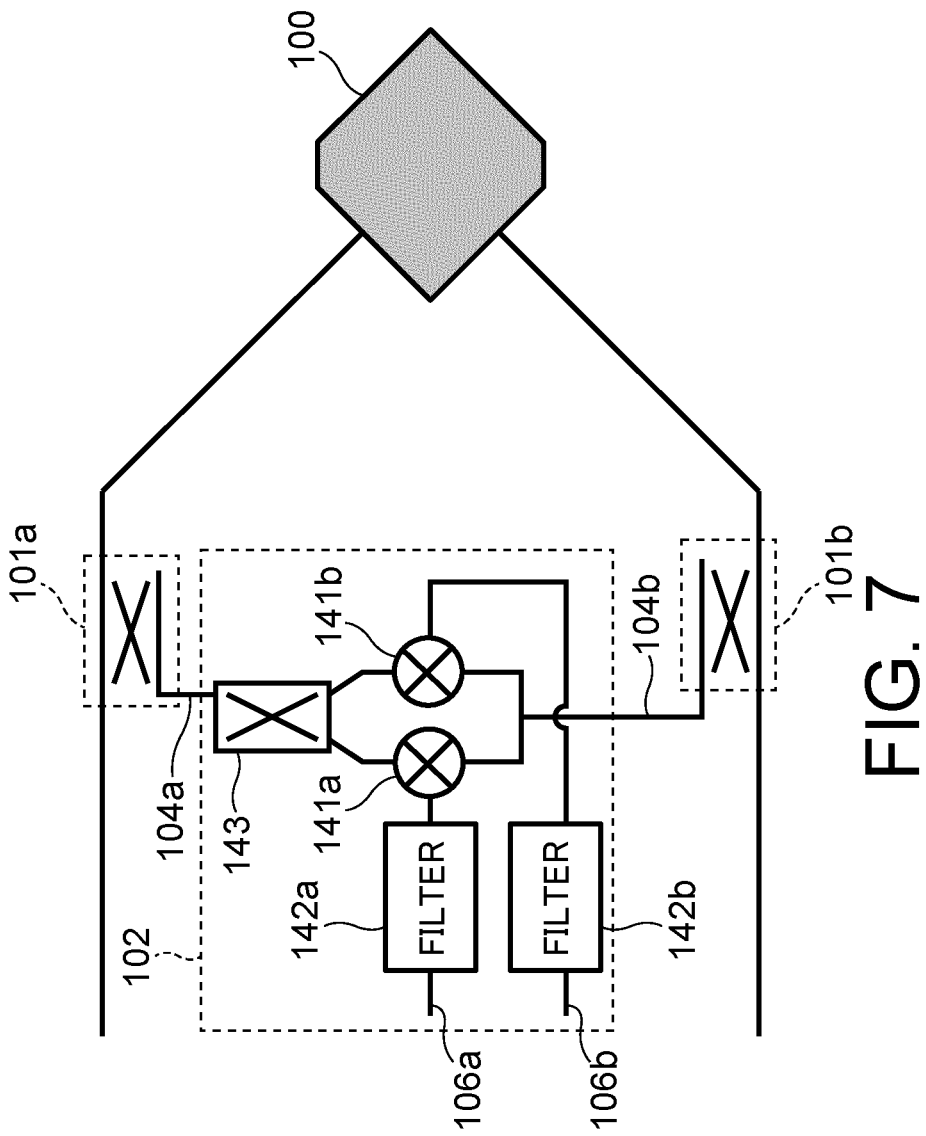
FIG. 7 is a diagram illustrating a further configuration example of the comparator circuit.

According to the configuration in FIG. 6, the phase is delayed by 90° by adjusting the length of the transmission line, but a configuration using a 90° hybrid coupler is also possible. FIG. 7 illustrates a configuration example (third configuration example) in this case. Using a 90° hybrid coupler 143, the phase is delayed by 90°. The 90° hybrid coupler 143 is connected between two mixers 141*a* and 141*b*, and the first coupling circuit 101*a*. The 90° hybrid coupler 143 separates a signal input from the first coupling circuit 101*a* into two signals, phases of which are caused to have a phase difference of 90°, and outputs one signal to the mixer 141*a* (or the mixer 141*b*) and the other signal to the mixer 141*b* (or the mixer 141*a*). As a configuration other than the configuration using a hybrid coupler, a phase difference of 90° may be provided using at least one of an inductor and a capacitor.

The mixers shown in FIG. 5 to FIG. 7 may be constructed of multiplication circuits or may be constructed using non-linear elements such as diodes or transistors. Although an example has been described where a filter is used to extract only a DC component from a signal output from the mixer, it is also possible to adopt a configuration using an image rejection mixer to thereby extract only a DC component without using any filter.

In FIG. 5 to FIG. 7, directional couplers are used as the first coupling circuit 101*a* and the second coupling circuit 101*b*, but hybrid couplers, magic Tees, T-branch circuits or the like may also be used.

Although an example using a mixer and a filter has been described in FIG. 5 to FIG. 7 as a configuration example of the comparator circuit 102, any configuration may be adopted for the comparator circuit 102 if it detects a phase difference between high frequency signals input from the transmission line 104*a* and the transmission line 104*b* and outputs a signal corresponding to the phase difference to the transmission line 106. Although a phase difference is detected using processing in an analog region, for example, in FIG. 5 to FIG. 7, it is possible to A/D-convert a right-hand circularly polarized wave signal and a left-hand circularly polarized wave signal using an AD converter, and compare the A/D-converted signals using the comparator circuit 102 to thereby detect a phase difference between the right-hand circularly polarized wave signal and the left-hand circularly polarized wave signal.

(Modification 1)

Figure 8:
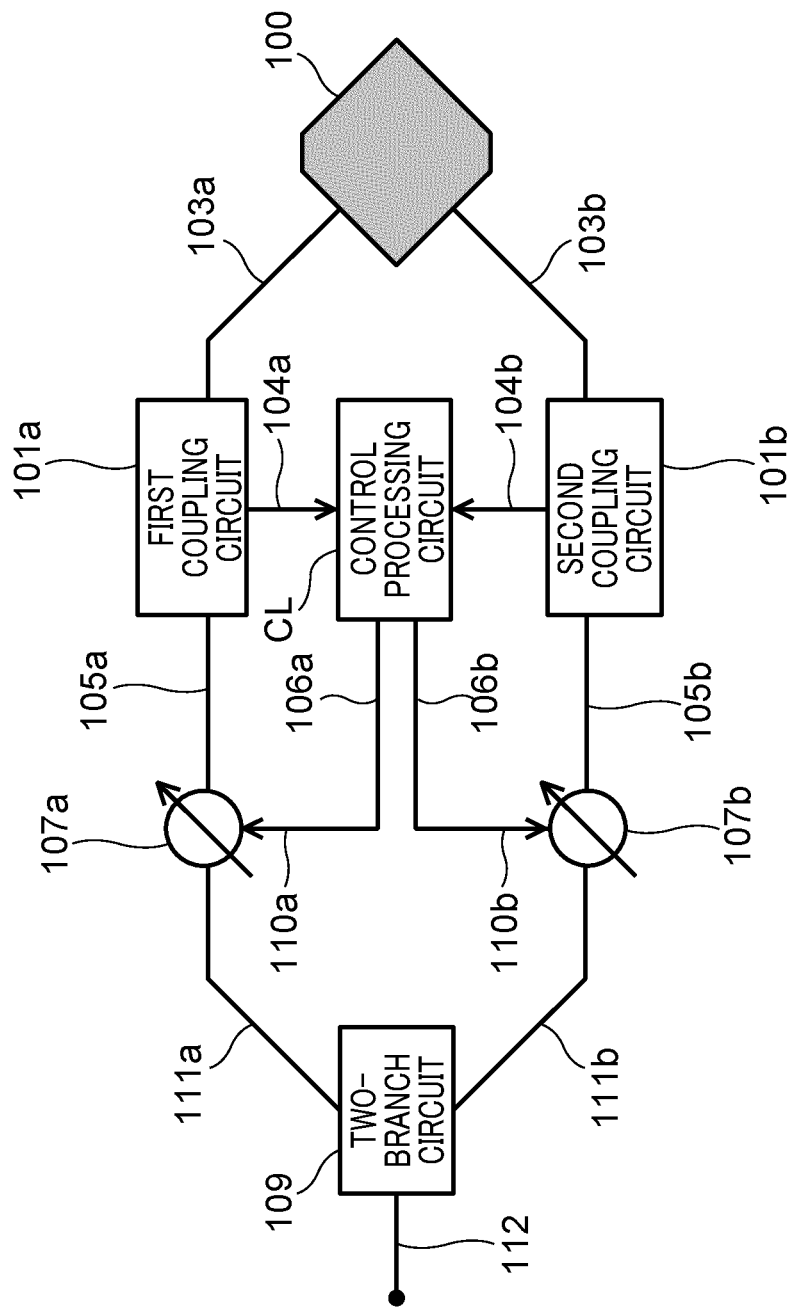
FIG. 8 is a diagram illustrating an antenna device according to a first modification.

The control circuit 108 and the comparator circuit 102 in the control processing circuit CL may be integrated. FIG. 8 illustrates a configuration example of an antenna device in this case. The control processing circuit CL is constructed as a single circuit provided with the functions of the control circuit 108 and the comparator circuit 102. The control processing circuit CL outputs control signals for controlling phase shift amounts of the first phase shifter 107*a* and the second phase shifter 107*b* to the transmission line 106*a* and the transmission line 106*b*. The transmission line 106*a* and the transmission line 106*b* are connected to the first phase shifter 107*a* and the second phase shifter 107*b*. Control signals output from the control processing circuit CL are input to the first phase shifter 107*a* and the second phase shifter 107*b* via the transmission line 106*a* and the transmission line 106*b*. In this way, the control circuit and the comparator circuit may be integrated into one identical circuit.

(Modification 2)

The comparator circuit 102 or the control circuit 108 may detect whether the antenna 100 has received an elliptically polarized wave or the antenna 100 has transmitted an elliptically polarized wave based on amplitudes of the right-hand circularly polarized wave signal and the left-hand circularly polarized wave signal. The elliptically polarized wave is a radio wave, a direction of which rotates, while the strength of an electric field is changing, and is a linearly polarized wave, the level of cross-polarization discrimination (XPD) of which has deteriorated. Note that the circularly polarized wave is a radio wave, the strength of an electric field of which is identical, and the direction of which rotates. When an amplitude difference between the right-hand circularly polarized wave signal and the left-hand circularly polarized wave signal is zero or small, this means that the antenna 100 transmits or receives a linearly polarized wave, but when the amplitude difference is large, this means that the level of the cross-polarization discrimination (XPD) of the transmitted or received linearly polarized wave has deteriorated and thereby the linearly polarized has changed to an elliptically polarized wave. The comparator circuit 102 or the control circuit 108 may output information as to whether an elliptically polarized wave has been received or transmitted to a device (not shown) (e.g., a display device) connected to the comparator circuit 102 or the control circuit 108.

(Modification 3)

The configuration of the first coupling circuit 101*a* may be identical to the configuration of the second coupling circuit 101*b*. At this time, since a transmission phase from the transmission line 103*a* to the transmission line 104*a* is equal to a transmission phase from the transmission line 103*b* to the transmission line 104*b*, an adjustment for a phase shift caused by the first coupling circuit 101*a* and the second coupling circuit 101*b* need not be made for the right-hand circularly polarized wave signal or the left-hand circularly polarized wave signal being transmitted through the transmission lines 103*a* and 103*b* or the transmission lines 104*a* and 104*b*. Furthermore, when the first coupling circuit 101*a* and the second coupling circuit 101*b* have the same configuration, insertion loss from the transmission line 103*a* to the transmission line 105*a* becomes equal to insertion loss from the transmission line 103*b* to the transmission line 105*b*, and therefore an adjustment for a phase shift caused by the first coupling circuit 101*a* and the second coupling circuit 101*b* need not be made for the right-hand circularly polarized wave signal or the left-hand circularly polarized wave signal being transmitted through the transmission lines 103*a* and 103*b* or the transmission lines 105*a* and 105*b*.

(Modification 4)

When an electrical length of a transmission line between the antenna 100 and the comparator circuit 102 through which the right-hand circularly polarized wave signal is transmitted is substantially equal to an electrical length of a transmission line between the antenna 100 and the comparator circuit 102 through which the left-hand circularly polarized wave signal is transmitted (including a case where both electrical lengths are completely equal; for example, even if there is a certain degree of design error, both electrical lengths can be said to be substantially equal, and the same shall apply hereinafter), phase variations of high frequency signals of the right-hand/left-hand circularly polarized waves caused by the transmission line become substantially equal. For this reason, it is possible to prevent degradation of detection accuracy of the polarization plane. For example, in the antenna device in FIG. 1, when the sum of the electrical lengths of the transmission lines 103a and 104a is equal to the sum of the electrical lengths of the transmission lines 103b and 104b, the phase variation of the right-hand circularly polarized wave signal by the transmission lines 103a and 104a becomes equal to the phase variation of the left-hand circularly polarized wave signal by the transmission lines 103b and 104b, and so it is possible to prevent degradation of detection accuracy of the polarization plane. If the sums of electrical lengths are equal, the electrical lengths of the transmission line 103a and the transmission line 103b may be different, and the electrical lengths of the transmission line 104a and the transmission line 104b may be different.

(Modification 5)

Figure 9:
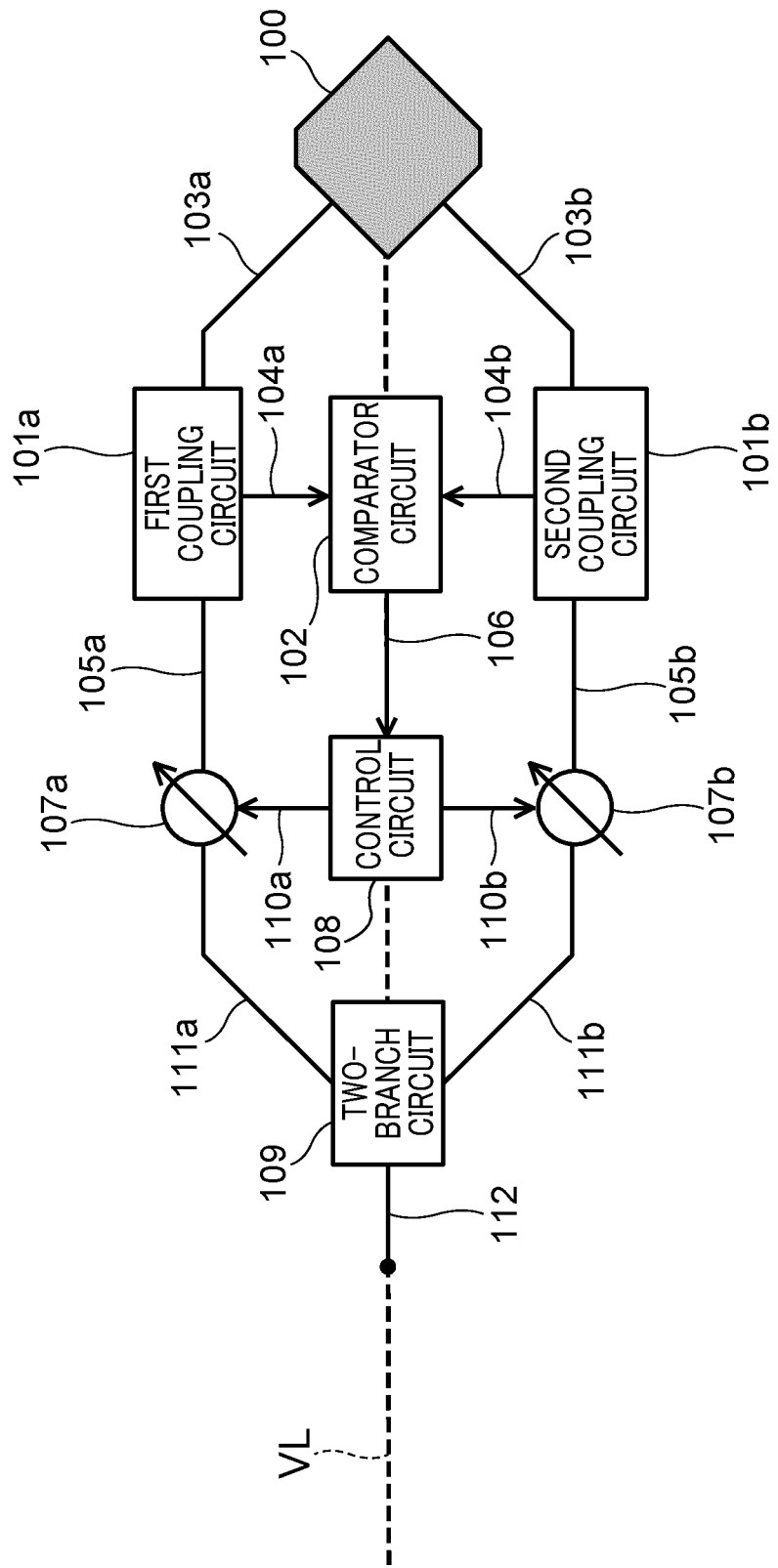
FIG. 9 is a diagram with a virtual line (axis of symmetry) added to FIG. 1.

When the shapes of the transmission lines 103a and 104a and the shapes of the transmission lines 103b and 104b can be said to be substantially symmetric when seen from the antenna 100 (including a case where the shapes are completely symmetric; for example, even if there is a certain degree of design error, both shapes can be said to be substantially equal, and the same shall apply hereinafter), a phase variation of the right-hand circularly polarized wave signal caused by the transmission lines 103a and 104a becomes substantially equal to a phase variation of the left-hand circularly polarized wave signal caused by the transmission lines 103b and 104b over a wide frequency band. For this reason, it is possible to prevent degradation of detection accuracy of the polarization plane over a wide frequency range. "Being substantially symmetric" when seen from the antenna 100 means, as shown, for example, in FIG. 9 in which a virtual line (axis of symmetry) is added to FIG. 1, that the shapes are substantially symmetric with respect to a virtual line (axis of symmetry) VL passing through the center of the antenna 100 and the center of the two-branch circuit 109 (e.g., a branch or joining point of a signal).

(Modification 6)

The first phase shifter 107a and the second phase shifter 107b in FIG. 1 or the like are configured to have the same insertion loss. In this case, during transmission, when the two-branch circuit 109 performs distribution with equal amplitudes, the amplitude of the right-hand circularly polarized wave signal passing through the first phase shifter 107a becomes substantially equal to the amplitude of the left-hand circularly polarized wave signal passing through the second phase shifter 107b, and it is thereby possible to prevent any elliptically polarized wave from being generated during transmission.

Furthermore, a phase shift amount adjustable range of the first phase shifter 107a may be equal to a phase shift amount adjustable range of the second phase shifter 107b. In this case, since the first phase shifter 107a and the second phase shifter 107b can be controlled using the same method, it is possible to simplify the control circuit 108 or a control scheme. Furthermore, the first phase shifter 107a and the second phase shifter 107b may have an identical configuration. In this case, the control circuit 108 or control scheme can further be simplified. Here, the term "identical" means that the phase shifters have the same model number, that substrate patterns have the same dimensions, that the circuit parts such as chip parts have the same constant.

(Modification 7)

The electrical length of the transmission line between the antenna 100 and the two-branch circuit 109 through which the right-hand circularly polarized wave signal is transmitted may be substantially equal to the electrical length of the transmission line between the antenna 100 and the two-branch circuit 109 through which the left-hand circularly polarized wave signal is transmitted. At this time, phase variations of the right-hand circularly polarized wave signal and the left-hand circularly polarized wave signal caused by the transmission lines become substantially equal, and it is thereby possible to prevent power loss when the two-branch circuit 109 synthesizes the right-hand circularly polarized wave signal and the left-hand circularly polarized wave signal during reception. Here, the expression that "electrical lengths are substantially equal" means that in the antenna device shown, for example, in FIG. 1, the sum of electrical lengths of the transmission lines 103a, 105a and 111a is substantially equal to the sum of electrical lengths of the transmission lines 103b, 105b and 111b.

Furthermore, the shape of the transmission line between the antenna 100 and the two-branch circuit 109 through which the right-hand circularly polarized wave signal is transmitted and the shape of the transmission line between the antenna 100 and the two-branch circuit 109 through which the left-hand circularly polarized wave signal is transmitted may be substantially symmetric when seen from the antenna 100. This equalizes variations in the amplitude and phase of the right-hand circularly polarized wave signal and the left-hand circularly polarized wave signal caused by the transmission lines over a wide frequency band. In this way, it is possible to prevent power loss when the two-branch circuit synthesizes the right-hand circularly polarized wave signal and the left-hand circularly polarized wave signal during reception over a wide band.

(Modification 8)

The control circuit 108 may also perform control such that a phase shift amount of one of the first phase shifter 107a and the second phase shifter 107b is fixed and a phase shift amount of the other phase shifter is shifted. This makes it possible to simplify the control circuit 108 or the control scheme. In that case, if the phase shift amount of the above one phase shifter is fixed to a maximum value or a minimum value in a variable range, it is possible to maximize the variable range of the polarization plane. For example, when a phase shifter having a phase shift amount of 0 to 180° is used as the first phase shifter 107a and the second phase shifter 107b, if the phase shift amount of the one phase shifter is fixed to 0° or 180° and the phase shift amount of the other phase shifter is varied within the range of 0 to 180°, the variable range of the polarization plane is maximized.

(Modification 9)

The shape of the two-branch circuit 109 may be substantially symmetric when seen from the antenna 100. In this case, since the two-branch circuit 109 has a wider band, the antenna device operates in a wider frequency band.

(Modification 10)

In FIG. 1, the first coupling circuit 101a may be configured not to divide the right-hand circularly polarized wave signal input from transmission line 103a but to output all the right-hand circularly polarized wave signal to the comparator circuit 102, and the second coupling circuit 101b may be configured not to divide the left-hand circularly polarized wave signal input from transmission line 103b but to output all the left-hand circularly polarized wave signal to the comparator circuit 102. With such a configuration, the control circuit 108 can also detect the polarization plane (polarization angle) of the radio wave.

Second Embodiment

Figure 10:
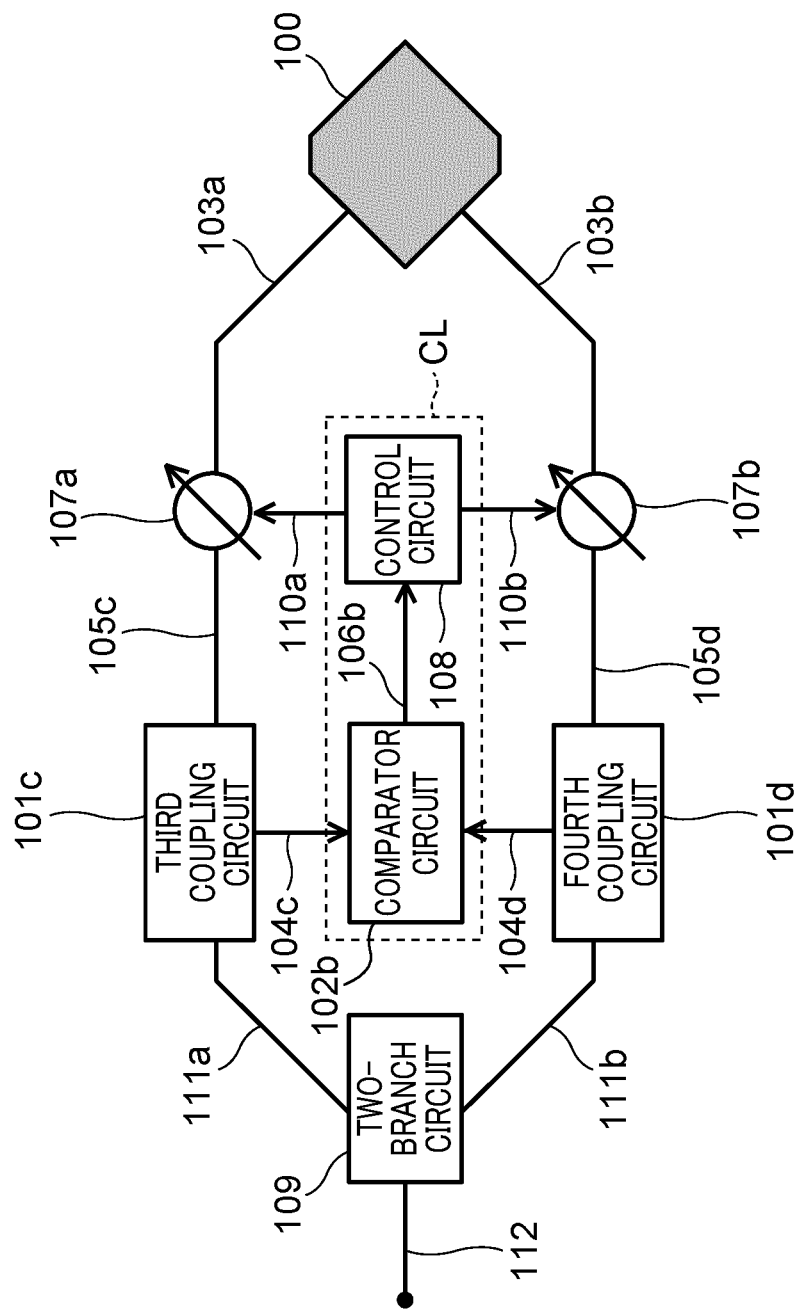
FIG. 10 is a diagram illustrating a schematic configuration of an antenna device according to a second embodiment.

FIG. 10 illustrates an antenna device according to a second embodiment. Elements identical or equivalent to those in FIG. 1 are assigned identical reference numerals and description thereof except for expanded functions will be omitted as appropriate.

The present embodiment is different from the first embodiment in that the two coupling circuits are disposed not on the antenna side of the two phase shifters 107a and 107b but on the two-branch circuit 109 side. A third coupling circuit (third circuit or first circuit) 101c is disposed between the first phase shifter 107a and the two-branch circuit 109. A fourth coupling circuit (fourth circuit or second circuit) 101d is disposed between the second phase shifter 107b and the two-branch circuit 109. A comparator circuit 102b is connected to the third coupling circuit 101c via a transmission line 104c and connected to the fourth coupling circuit 101d via a transmission line 104d. The comparator circuit 102b is connected to the control circuit 108 via a transmission line 106b. The first phase shifter 107a is connected to a right-hand circularly polarized wave terminal of the antenna 100 via the transmission line 103a. The second phase shifter 107b is connected to a left-hand circularly polarized wave terminal of the antenna 100 via the transmission line 103b. The third coupling circuit 101c and the fourth coupling circuit 101d have configurations similar to those of the first coupling circuit 101a and the second coupling circuit 101b in FIG. 10. The comparator circuit 102b has a configuration similar to that of the comparator circuit 102.

The first phase shifter 107a shifts the phase of the right-hand circularly polarized wave signal input from the transmission line 103a and outputs the shifted signal to a transmission line 105c. The second phase shifter 107b shifts the phase of the left-hand circularly polarized wave signal input from the transmission line 103b and outputs the shifted signal to a transmission line 105d. The third coupling circuit 101c divides power of the right-hand circularly polarized wave signal input from the transmission line 105c, outputs the one portion of the power (third right-hand circularly polarized wave signal) to the transmission line 104c and the other portion of the power (fourth right-hand polarized wave signal) to the transmission line 111a. The fourth coupling circuit 101d divides power of the left-hand circularly polarized wave signal input from the transmission line 105d, outputs the one portion of the power (third left-hand circularly polarized wave signal) to the transmission line 104d and the other portion of the power (fourth left-hand polarized wave signal) to transmission line 111b. The comparator circuit 102b detects a phase difference between the right-hand circularly polarized wave signal input from the transmission line 104c and the left-hand circularly polarized wave signal input from the transmission line 104d. The control circuit 108 controls a phase shift amount of at least one of the first phase shifter 107a and the second phase shifter 107b based on the detected phase difference. The two-branch circuit 109 synthesizes the right-hand circularly polarized wave signal (fourth right-hand polarized wave signal) input from the transmission line 111a and the left-hand circularly polarized wave signal (fourth left-hand polarized wave signal) input from the transmission line 111b and outputs the synthesized signal to the transmission line 112.

The configuration in FIG. 10 allows adjustments of phase shift amounts of the first phase shifter 107a and the second phase shifter 107b to be simplified through feedback control during reception in the antenna 100. When, for example, the comparator circuit 102b is constructed of a mixer and a filter, the right-hand circularly polarized wave signal (third right-hand circularly polarized wave signal) and the left-hand circularly polarized wave signal (third left-hand circularly polarized wave signal) are input to the mixer in the comparator circuit 102b via the transmission line 104c and the transmission line 104d respectively. Of the output signals of the mixer, a second harmonic signal is removed in the filter and the rest of the signal is obtained as described above, as a DC signal proportional to $e_1 e_2 \cos(\Delta\psi)$. In order to maximize $e_1 e_2 \cos(\Delta\psi)$, the control circuit 108 adjusts the phase shift amounts of the first phase shifter 107a and the second phase shifter 107b (feedback control). This causes the phase difference $\Delta\psi$ to become zero or close to zero, and the right-hand circularly polarized wave signal transmitted through the transmission line 111a and the left-hand circularly polarized wave signal transmitted through the transmission line 111b are synthesized in phase in the two-branch circuit 109.

Third Embodiment

Figure 11:
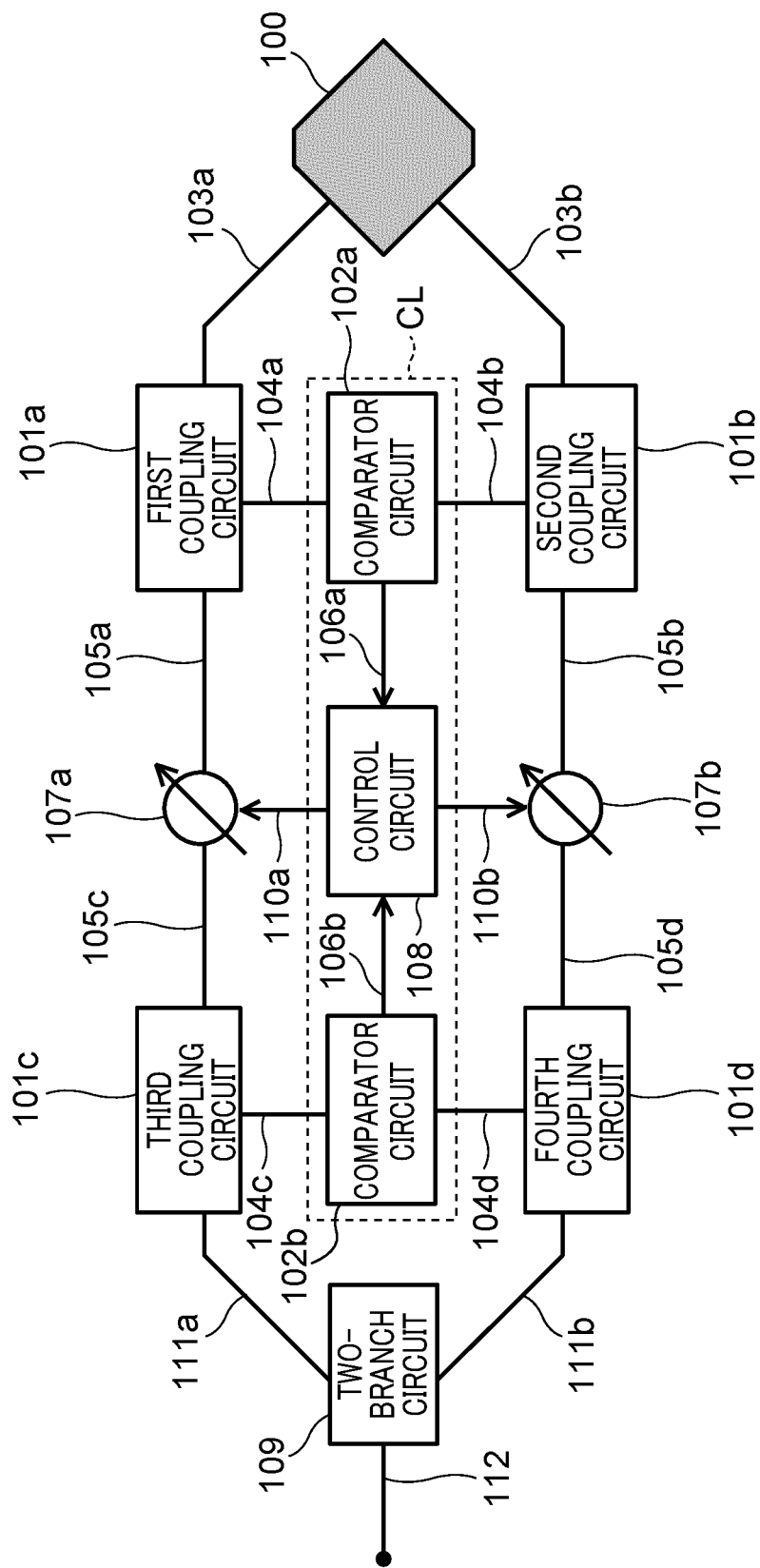
FIG. 11 is a diagram illustrating a schematic configuration of an antenna device according to a third embodiment.

FIG. 11 illustrates an example of an antenna device according to a third embodiment. The third embodiment combines the first embodiment in FIG. 1 and the second embodiment in FIG. 10. More specifically, the first coupling circuit 101a shown in FIG. 1, the second coupling circuit 101b and the comparator circuit 102 (102a is the reassigned number) are added to the second embodiment in FIG. 10. The first coupling circuit 101a is connected to the first phase shifter 107a via the transmission line 105a and connected to the right-hand circularly polarized wave terminal of the antenna 100 via the transmission line 103a. The second coupling circuit 101b is connected to the second phase shifter 107b via the transmission line 105b and connected to the left-hand circularly polarized wave terminal of the antenna 100 via the transmission line 103b. The comparator circuit 102a is connected to the control circuit 108 via the transmission line 106a.

With the above configuration, during transmission, the control circuit 108 can perform feedback control of phase shift amounts of the first phase shifter 107a and the second phase shifter 107b using transmission phase difference information from the comparator circuit 102a. During reception, the control circuit 108 can perform feedback control of phase shift amounts of the first phase shifter 107a and the second phase shifter 107b using reception phase difference information from the comparator circuit 102b. Therefore, it is possible to more accurately control the phase shift amounts of the first phase shifter 107a and the second phase shifter 107b during both transmission and reception.

Fourth Embodiment

Figure 12:
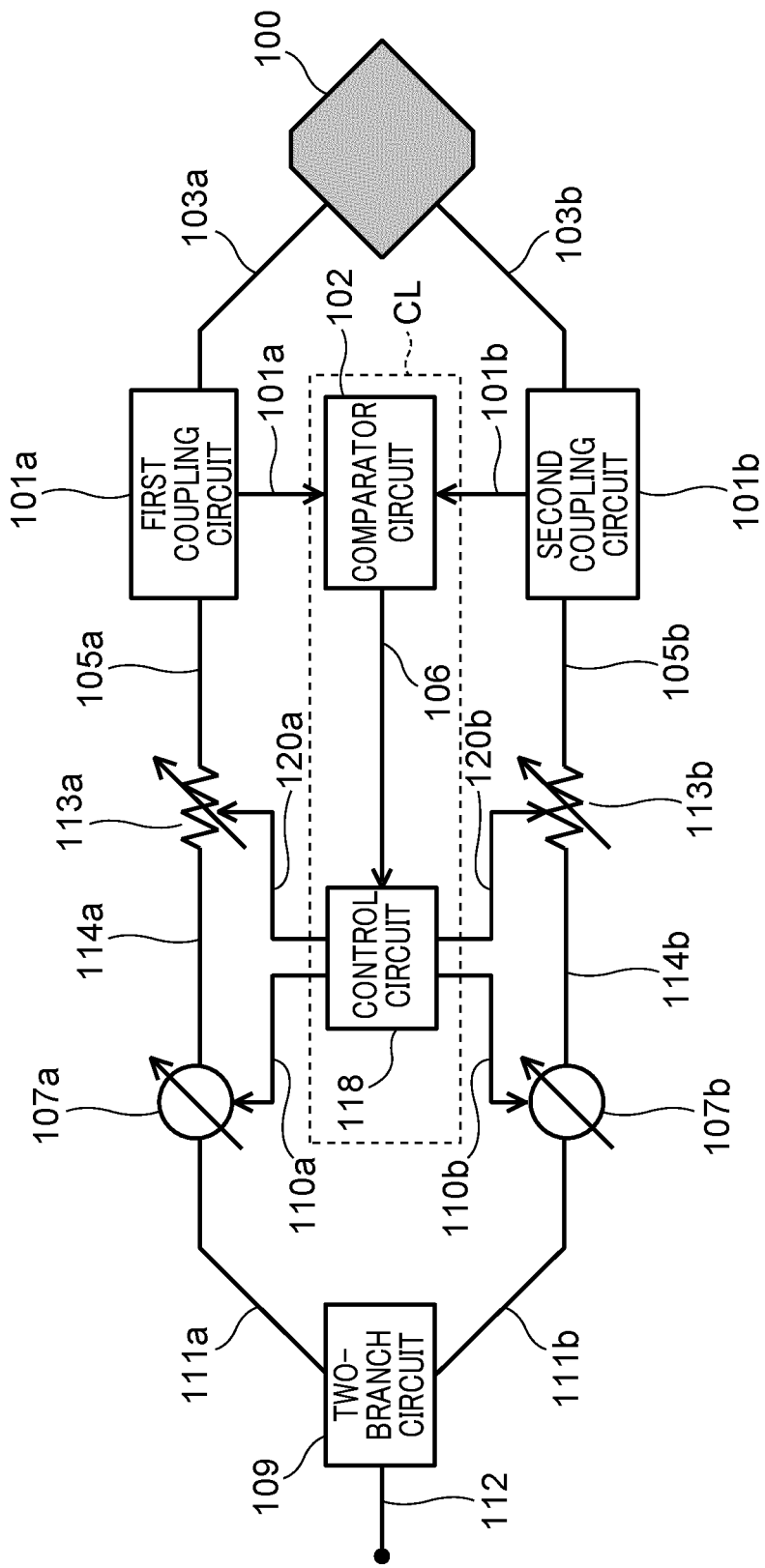
FIG. 12 is a diagram illustrating a schematic configuration of an antenna device according to a fourth embodiment.

FIG. 12 illustrates an antenna device according to a fourth embodiment. A first amplitude adjustment circuit 113a and a second amplitude adjustment circuit 113b are added to the configuration in FIG. 1.

The first amplitude adjustment circuit 113a is connected to the first coupling circuit 101a via the transmission line 105a, connected to the first phase shifter 107a via a transmission line 114a and connected to a control circuit 118 via a transmission line 120a. On the other hand, the second amplitude adjustment circuit 113b is connected to the second coupling circuit 101b via the transmission line 105b, connected to the second phase shifter 107b via a transmission line 114b and connected to the control circuit 118 via a transmission line 120b.

The comparator circuit 102 detects an amplitude of the right-hand circularly polarized wave signal input from the first coupling circuit 101a and an amplitude of the left-hand circularly polarized wave signal input from the second coupling circuit 101b. The comparator circuit 102 outputs a signal including information indicating the detected amplitude (amplitude information) to the control circuit 118 via the transmission line 106. The amplitude information detected during reception may be referred to as "reception amplitude information" and the amplitude information detected during transmission may be referred to as "transmission amplitude information." Furthermore, the comparator circuit 102 detects phase difference information of both signals as in the cases of the embodiments described so far, and outputs a signal including the detected phase difference information (reception phase difference information or transmission phase difference information) to the control circuit 118. The amplitude information and the phase difference information may be sent through different transmission lines or through the same transmission line. That is, the transmission line 106 may be a single transmission line or a plurality of transmission lines. Furthermore, information on the sum, difference, product, quotient or the like of the amplitudes of the right-hand circularly polarized wave signal and the left-hand circularly polarized wave signal may be output to the transmission line 106.

The control circuit 118 controls the first amplitude adjustment circuit 113a and the second amplitude adjustment circuit 113b based on the amplitude information indicated by the signal input from the transmission line 106 (reception amplitude information or transmission amplitude information) so as to make zero or reduce the amplitude difference between both signals. More specifically, the control circuit 118 determines control values of the first amplitude adjustment circuit 113a and the second amplitude adjustment circuit 113b so as to make zero or reduce the amplitude difference between both signals and outputs a control signal indicating the determined control value to the first amplitude adjustment circuit 113a and the second amplitude adjustment circuit 113b via the transmission lines 120a and 120b. The control value is a parameter value that adjusts a fluctuation of the amplitude.

The first amplitude adjustment circuit 113a attenuates or amplifies the amplitude of the right-hand circularly polarized wave signal based on a control value included in the control signal input from the control circuit 118. On the other hand, the second amplitude adjustment circuit 113b attenuates or amplifies the amplitude of the left-hand circularly polarized wave signal based on a control value included in the control signal input from the control circuit 118. The first amplitude adjustment circuit 113a and the second amplitude adjustment circuit 113b may be a variable attenuator or a variable amplifier. The first amplitude adjustment circuit 113a and the second amplitude adjustment circuit 113b may be configured to adjust amplitude continuously or adjust amplitude discretely. Only one of the first amplitude adjustment circuit 113a and the second amplitude adjustment circuit 113b may be provided.

The provision of the first amplitude adjustment circuit 113a and the second amplitude adjustment circuit 113b allows the amplitude difference between the right-hand circularly polarized wave signal and the left-hand circularly polarized wave signal to be compensated. This makes it possible to prevent power of a signal output from the two-branch circuit 109 from decreasing during reception or prevent an elliptically polarized wave from the antenna 100 from being transmitted during transmission. The amplitude difference between the right-hand circularly polarized wave signal and the left-hand circularly polarized wave signal can be generated caused by various factors: a difference in insertion loss between the first phase shifter 107a and the second phase shifter 107b; a difference in insertion loss between the first coupling circuit 101a and the second coupling circuit 101b, a difference in the sum of electrical lengths of the transmission line from the two-branch circuit 109 or the antenna 100 to the first amplitude adjustment circuit 113a and the second amplitude adjustment circuit 113b or the like.

The first amplitude adjustment circuit 113a and the second amplitude adjustment circuit 113b may have the same configuration. In this case, since a phase variation of the right-hand circularly polarized wave signal by the first amplitude adjustment circuit 113a is equal to a phase variation of the left-hand circularly polarized wave signal by the second amplitude adjustment circuit 113b over a wide frequency range, it is possible to prevent power output to the transmission line 112 from decreasing during reception over a wide frequency range.

The above configuration allows a difference between the amplitude of the right-hand circularly polarized wave signal being transmitted through the transmission line 105a and the amplitude of the left-hand circularly polarized wave signal being transmitted through the transmission line 105b to be fed back to the control circuit 118 during transmission. Therefore, a linearly polarized wave with a high level of cross-polarization discrimination can be generated by controlling the attenuation amount or amplification amount in accordance with an amplitude difference between the right-hand circularly polarized wave signal and the left-hand circularly polarized wave signal. Although a difference in amplitude is produced between the right-hand circularly polarized wave signal and the left-hand circularly polarized wave signal due to differences in insertion loss or the like between the first phase shifter 107a and the second phase shifter 107b, a linearly polarized wave with a high level of cross-polarization discrimination can be generated by reducing the amplitude difference through the first amplitude adjustment circuit 113a or the second amplitude adjustment circuit 113b. During reception, it is possible to prevent power of signals output from the two-branch circuit 109 from decreasing by reducing the amplitude difference through the first amplitude adjustment circuit 113a or the second amplitude adjustment circuit 113b.

Fifth Embodiment

The antenna devices according to the respective embodiments and modifications described so far are advantageous when a polarization plane of a counterpart antenna of wireless communication such as a wireless LAN access point, a base station, a radar, a remote sensing system or a remote controller is unknown or when a communication counterpart moves. It is possible to detect a polarization plane of a counterpart antenna from a signal received from the counterpart without mechanically moving the antenna and transmit a radio wave by causing the polarization planes to align with each other. Improvement of communication quality and communication distances, provision of a multi-functioned radar or the like can be expected. Furthermore, the antenna devices according to the respective embodiments and modifications described so far can also be used as antennas for a power transmission device or power reception device when performing wireless power transmission. When the antenna device is used, for example, as an antenna for a power transmission device, a high frequency signal having a power transmission frequency generated by the power transmission device is input to the two-branch circuit 109. In this case, efficient power transmission is made possible by adjusting the polarization plane of an electromagnetic wave transmitted from the power transmission device in accordance with the polarization plane of the antenna of the power reception device. When the antenna device is used as a power reception device, efficient power reception is also made possible by performing control so that the two-branch circuit synthesizes signals with equal phases.

Figure 13:
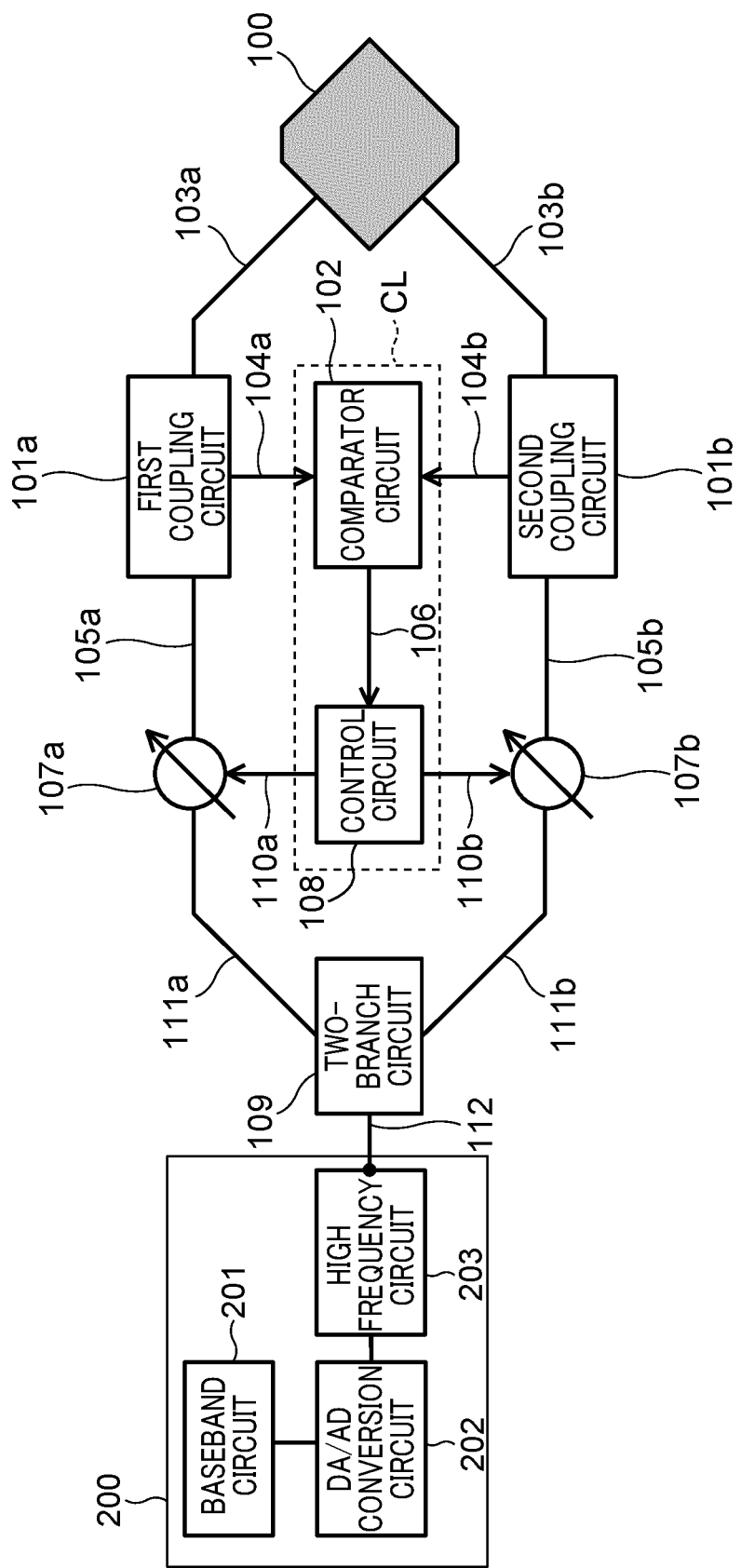
FIG. 13 is a diagram illustrating a configuration example of a wireless communication device provided with the antenna device and the wireless communication circuit in FIG. 1.

An example where the present antenna device is applied to a wireless communication device such as an access point of a wireless LAN or the like will be described using FIG. 13. FIG. 13 illustrates a configuration example of a wireless communication device provided with the antenna device in FIG. 1 and a wireless communication circuit 200. The antenna devices in the other embodiments or modifications described so far may also be used instead of the antenna device in FIG. 1.

The wireless communication circuit 200 carries out wireless communication with a counterpart wireless communication device using the antenna device. The wireless communication circuit 200 includes a baseband circuit 201, a DA/AD conversion circuit 202, and a high frequency circuit 203. The baseband circuit 201 generates a frame or packet compliant with a communication scheme, a specification or the like used and encodes and modulates a digital signal of the frame or packet generated. The DA/AD conversion circuit 202 converts the modulated digital signal to an analog signal. The high frequency circuit 203 extracts a signal of a desired bandwidth from the analog signal through band control, frequency-converts the extracted signal to a wireless frequency, amplifies the converted signal (high frequency signal) through an amplifier and outputs the signal to the two-branch circuit 109. The amplifier of the high frequency circuit 203 is connected to the transmission line 112. During reception, the high frequency circuit 203 receives a high frequency signal from the two-branch circuit 109. The high frequency circuit 203 low-noise amplifies the received signal through an LNA (Low Noise Amplifier), extracts a signal with a desired bandwidth from the amplified signal, frequency-converts the extracted signal to a baseband and outputs the baseband signal to the DA/AD conversion circuit 202. The DA/AD conversion circuit 202 converts the input baseband signal to a digital signal and outputs the digital signal to the baseband circuit 201. The baseband circuit 201 demodulates and decodes the input digital signal and acquires a frame or a packet.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An antenna device comprising:
    an antenna configured to receive a radio wave signal and separate the radio wave signal into a right-hand circularly polarized wave signal and a left-hand circularly polarized wave signal;
    a first circuit configured to divide the right-hand circularly polarized wave signal into a first right-hand circularly polarized wave signal and a second right-hand circularly polarized wave signal;
    a second circuit configured to divide the left-hand circularly polarized wave signal into a first left-hand circularly polarized wave signal and a second left-hand circularly polarized wave signal; and
    a control processing circuit configured to detect a phase difference between the first right-hand circularly polarized wave signal and the first left-hand circularly polarized wave signal.

2. The antenna device according to claim 1, further comprising:
    a first phase shifter configured to be able to shift a phase of the second right-hand circularly polarized wave signal; and
    a second phase shifter configured to be able to shift a phase of the second left-hand circularly polarized wave signal, wherein
    the control processing circuit controls at least one of the first phase shifter and the second phase shifter based on the phase difference.

3. The antenna device according to claim 2, further comprising a branch circuit configured to synthesize the second right-hand circularly polarized wave signal adjusted by the first phase shifter and the second left-hand circularly polarized wave signal adjusted by the second phase shifter and output the synthesized signal.

4. The antenna device according to claim 3, wherein a shape of the branch circuit is substantially symmetric with respect to the antenna.

5. The antenna device according to claim 3, wherein a sum of electrical lengths of transmission lines connecting among the antenna, the first circuit, the first phase shifter and the branch circuit is substantially equal to a sum of electrical lengths of transmission lines connecting among the antenna, the second circuit, the second phase shifter and the branch circuit.

6. The antenna device according to claim 3, wherein a shape of transmission lines connecting among the antenna, the first circuit, the first phase shifter and the branch circuit is substantially symmetric to a shape of transmission lines connecting among the antenna, the second circuit, the second phase shifter and the branch circuit when seen from the antenna.

7. The antenna device according to claim 2, wherein the control processing circuit fixes a phase shift amount of one of the first phase shifter and the second phase shifter to a maximum value or a minimum value of a range of phase shift amount of the one phase shifter and shifts a phase shift amount of the other phase shifter.

8. The antenna device according to claim 2, wherein insertion loss of the first phase shifter is substantially equal to insertion loss of the second phase shifter.

9. The antenna device according to claim 2, wherein the first phase shifter has a configuration identical to the configuration of the second phase shifter.

10. The antenna device according to claim 1, wherein the control processing circuit detects the phase difference using an amplitude of the first right-hand circularly polarized wave signal and an amplitude of the first left-hand circularly polarized wave signal.

11. The antenna device according to claim 1, further comprising:
a first amplitude adjustment circuit configured to be able to adjust an amplitude of the second right-hand circularly polarized wave signal; and
a second amplitude adjustment circuit configured to be able to adjust an amplitude of the second left-hand circularly polarized wave signal, wherein
the control processing circuit controls at least one of the first amplitude adjustment circuit and the second amplitude adjustment circuit based on a difference between an amplitude of the second right-hand circularly polarized wave signal and an amplitude of the second left-hand circularly polarized wave signal.

12. The antenna device according to claim 11, wherein the first amplitude adjustment circuit has a configuration identical to the configuration of the second amplitude adjustment circuit.

13. The antenna device according to claim 1, further comprising:
a first phase shifter configured to be able to shift a phase of the right-hand circularly polarized wave signal; and
a second phase shifter configured to be able to shift a phase of the left-hand circularly polarized wave signal, wherein
the first circuit divides the right-hand circularly polarized wave signal adjusted by the first phase shifter into a third right-hand circularly polarized wave signal and a fourth right-hand circularly polarized wave signal,
the second circuit divides the left-hand circularly polarized wave signal adjusted by the second phase shifter into a third left-hand circularly polarized wave signal and a fourth left-hand circularly polarized wave signal, and
the control processing circuit controls at least one of the first phase shifter and the second phase shifter based on a phase difference between the third right-hand circularly polarized wave signal and the third left-hand circularly polarized wave signal.

14. The antenna device according to claim 13, further comprising a branch circuit configured to synthesize the fourth right-hand circularly polarized wave signal and the fourth left-hand circularly polarized wave signal and output the synthesized signal.

15. The antenna device according to claim 1, further comprising:
a first phase shifter configured to be able to shift a phase of the second right-hand circularly polarized wave signal;
a second phase shifter configured to be able to shift a phase of the second left-hand circularly polarized wave signal;
a third circuit configured to divide the second right-hand circularly polarized wave signal adjusted by the first phase shifter into a third right-hand circularly polarized wave signal and a fourth right-hand circularly polarized wave signal; and
a fourth circuit configured to divide the second left-hand circularly polarized wave signal adjusted by the second phase shifter into a third left-hand circularly polarized wave signal and a fourth left-hand circularly polarized wave signal, wherein
the control processing circuit controls at least one of the first phase shifter and the second phase shifter based on a phase difference between the first right-hand circularly polarized wave signal and the first left-hand circularly polarized wave signal, and
the control processing circuit controls at least one of the first phase shifter and the second phase shifter based on a phase difference between the third right-hand circularly polarized wave signal and the third left-hand circularly polarized wave signal.

16. The antenna device according to claim 15, further comprising a branch circuit configured to synthesize the fourth right-hand circularly polarized wave signal and the fourth left-hand circularly polarized wave signal and output the synthesized signal.

17. The antenna device according to claim 1, wherein a sum of an electrical length of a transmission line connecting between the antenna and the first circuit and an electrical length of a transmission line connecting between the first circuit and the control processing circuit is substantially equal to a sum of an electrical length of a transmission line connecting between the antenna and the second circuit and an electrical length of a transmission line connecting between the second circuit and the control processing circuit.

18. The antenna device according to claim 1, wherein a shape of a transmission line connecting between the antenna and the first circuit and a shape of a transmission line connecting between the first circuit and the control processing circuit are substantially symmetric to a shape of a transmission line connecting between the antenna and the second circuit and a shape of a transmission line connecting between the second circuit and the control processing circuit with respect to the antenna.

19. The antenna device according to claim 1, wherein the first circuit has a configuration identical to the configuration of the second circuit.

20. A signal reception method comprising:
separating a radio wave signal received via an antenna into a right-hand circularly polarized wave signal and a left-hand circularly polarized wave signal;
dividing the right-hand circularly polarized wave signal into a first right-hand circularly polarized wave signal and a second right-hand circularly polarized wave signal;
dividing the left-hand circularly polarized wave signal into a first left-hand circularly polarized wave signal and a second left-hand circularly polarized wave signal; and
detecting a phase difference between the first right-hand circularly polarized wave signal and the first left-hand circularly polarized wave signal.

* * * * *